(12) United States Patent
Kagawa

(10) Patent No.: US 10,056,697 B2
(45) Date of Patent: Aug. 21, 2018

(54) NEAR-FIELD ELECTROMAGNETIC WAVE ABSORBING FILM

(71) Applicant: Seiji Kagawa, Koshigaya (JP)

(72) Inventor: Seiji Kagawa, Koshigaya (JP)

( * ) Notice: Subject to any disclaimer, the term of this patent is extended or adjusted under 35 U.S.C. 154(b) by 81 days.

(21) Appl. No.: 15/363,793

(22) Filed: Nov. 29, 2016

(65) Prior Publication Data

US 2017/0288314 A1    Oct. 5, 2017

(30) Foreign Application Priority Data

Apr. 1, 2016   (JP) .................................. 2016-074369

(51) Int. Cl.
*H01Q 17/00*   (2006.01)

(52) U.S. Cl.
CPC .................................. *H01Q 17/007* (2013.01)

(58) Field of Classification Search
CPC .................................................... H01Q 17/007
See application file for complete search history.

(56) References Cited

U.S. PATENT DOCUMENTS

| 5,855,988 A | 1/1999 | Matsuo |
| 2011/0008580 A1 | 1/2011 | Kagawa et al. |
| 2015/0382518 A1 | 12/2015 | Kagawa et al. |

FOREIGN PATENT DOCUMENTS

| JP | 09-148782 A | 6/1997 |
| WO | WO 2010/093027 A1 | 8/2010 |

*Primary Examiner* — Graham Smith
(74) *Attorney, Agent, or Firm* — Birch, Stewart, Kolasch & Birch, LLP

(57) ABSTRACT

A near-field electromagnetic wave absorbing film comprising a plastic film, and a single- or multi-layer, thin metal film formed on its surface; the thin metal film having laser-beam-bored holes of 200 μm or less in diameter with intervals of 50 μm or less on the entire surface, and pluralities of openings as large as giving transmission viewability partially on the surface.

8 Claims, 18 Drawing Sheets

1000 μm

1000 μm

NEAR-FIELD ELECTROMAGNETIC WAVE ABSORBING FILM

FIELD OF THE INVENTION

The present invention relates to a near-field electromagnetic wave absorbing film having excellent electromagnetic wave absorbability and transmission viewability.

BACKGROUND OF THE INVENTION

Electromagnetic wave absorbing sheets for preventing the leak and intrusion of electromagnetic waves are used in communications equipments such as cell phones, smartphones, wireless LANs, etc., and electronic appliances such as computers, etc. Electromagnetic wave absorbing sheets widely used at present are formed by metal sheets or nets, and electromagnetic wave absorbing sheets comprising vapor-deposited metal films formed on plastic sheets are recently proposed. For example, JP 9-148782 A proposes an electromagnetic wave absorbing sheet comprising a plastic film, and first and second vapor-deposited aluminum films formed on both surfaces of the plastic film, the first vapor-deposited aluminum film being etched in a non-conductive linear pattern, and the second vapor-deposited aluminum film being etched in a conductive network-shaped pattern.

WO 2010/093027 discloses a composite film comprising a single- or multi-layer, thin metal film formed on at least one surface of a plastic film, the thin metal film being provided with large numbers of substantially parallel, intermittent linear scratches with irregular widths and intervals in plural directions, thereby having reduced anisotropy of electromagnetic wave absorbability.

In the electromagnetic wave absorbing sheet of JP 9-148782 A and the composite film of WO 2010/093027 having a linear-scratched thin metal film, the electromagnetic wave absorbability is obtained by linear pattern or linear scratches. However, it is also desired to efficiently obtain an electromagnetic wave absorbing film having excellent electromagnetic wave absorbability by forming laser-beam-bored holes in a pattern.

Further, due to the demand of transparent electromagnetic wave absorbing films, electromagnetic wave absorbing films having thin ITO films or thin CNT films are proposed, and used for ETCs, etc. However, electromagnetic wave absorbing films used for ETCs are far-field electromagnetic wave absorbing films, which are not used as near-field electromagnetic wave absorbing films because of difficulty in impedance control for near-field electromagnetic waves. Thus desired is a near-field electromagnetic wave absorbing film comprising an opaque layer having electromagnetic wave absorbability, through which items can be viewed. Such characteristic is called "transmission viewability."

OBJECT OF THE INVENTION

Accordingly, an object of the present invention is to provide a near-field electromagnetic wave absorbing film having excellent electromagnetic wave absorbability and transmission viewability.

SUMMARY OF THE INVENTION

As a result of intensive research in view of the above object, the inventor has found that with (a) laser-beam-bored holes of 200 μm or less in diameter formed with intervals of 50 μm or less, and (b) pluralities of openings as large as giving transmission viewability formed partially, on an entire surface of a thin metal film on a plastic film, a near-field electromagnetic wave absorbing film having excellent electromagnetic wave absorbability and transmission viewability can be obtained. The present invention has been completed based on such finding.

Thus, the near-field electromagnetic wave absorbing film of the present invention comprises a plastic film, and a single- or multi-layer, thin metal film formed on at least one surface of the plastic film;

the thin metal film having laser-beam-bored holes of 200 μm or less in diameter with intervals of 50 μm or less on the entire surface, and pluralities of openings as large as giving transmission viewability partially on the surface.

The diameters of the laser-beam-bored holes are preferably 100 μm or less, more preferably 20-100 μm.

The laser-beam-bored holes are arranged preferably with intervals of 20 μm or less.

The openings formed in the thin metal film are arranged preferably in at least two directions.

The area ratio of the openings in the thin metal film is preferably 15-60%.

The thickness of the thin metal film is preferably 10-300 nm.

The thin metal film is preferably at least one metal selected from the group consisting of aluminum, copper, silver, tin, nickel, cobalt, chromium and their alloys.

DESCRIPTION OF THE PREFERRED EMBODIMENTS

The embodiments of the present invention will be explained referring to the attached drawings, and it should be noted that explanation concerning one embodiment is applicable to other embodiments unless otherwise mentioned. Also, the following explanations are not restrictive, but various modifications may be made within the scope of the present invention.

[1] Bored Thin Metal Film

Figure 1A:
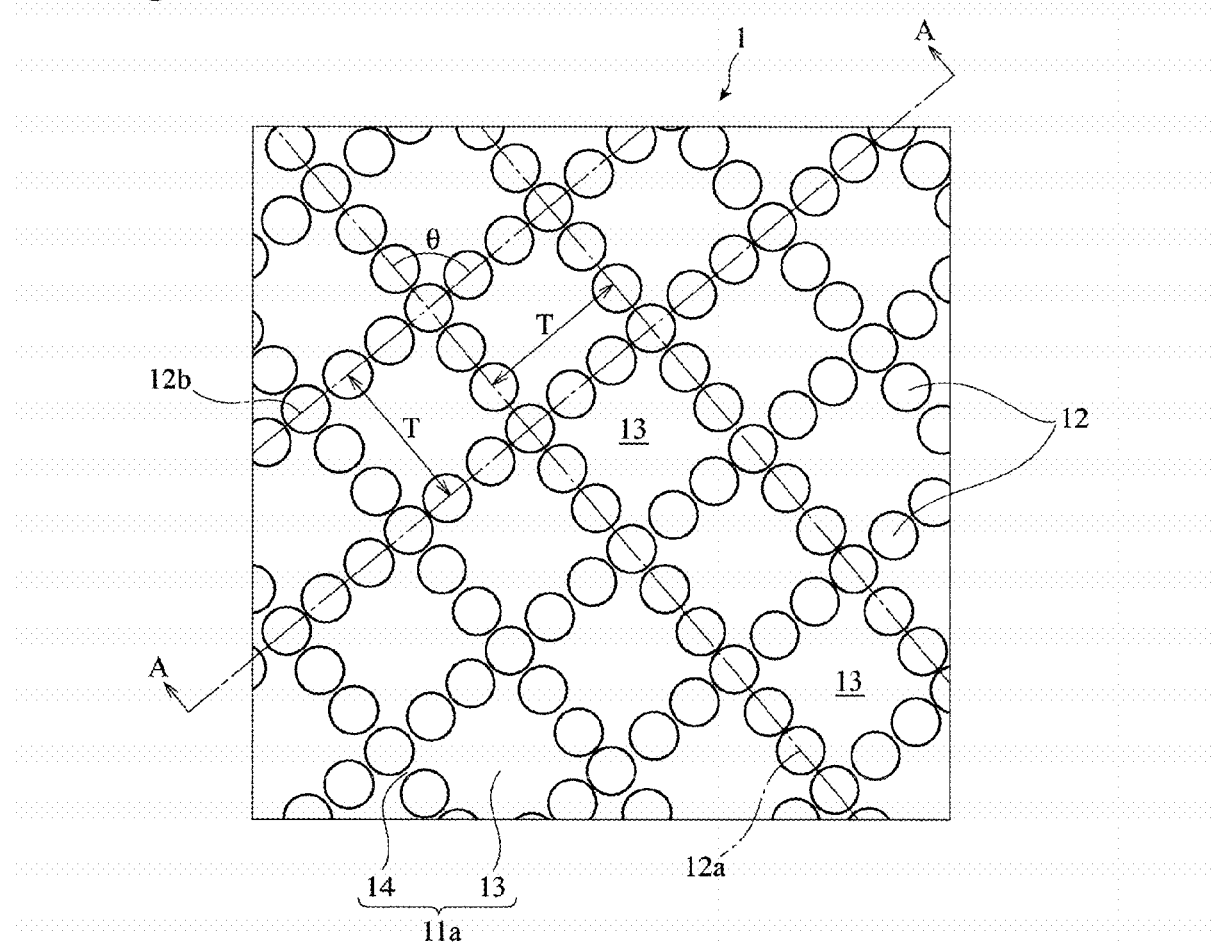
FIG. 1(a) is a partial, enlarged plan view showing an example of arrangements of fine laser-beam-bored holes for forming the near-field electromagnetic wave absorbing film of the present invention.
Figure 1B:
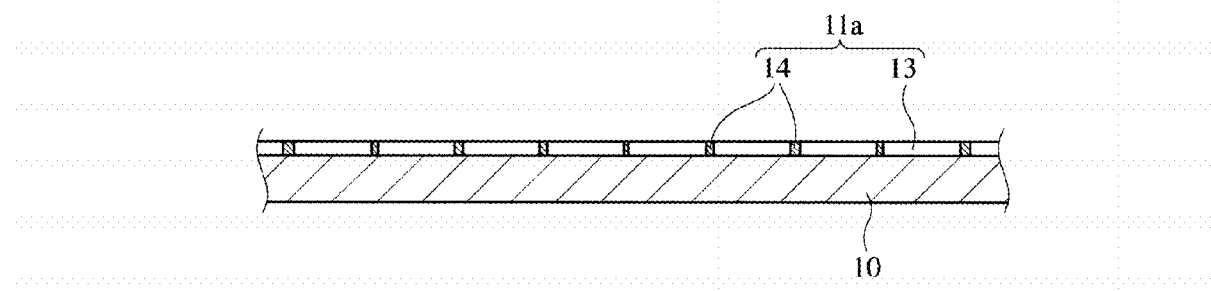
FIG. 1(b) is a cross-sectional view taken along the line A-A in FIG. 1.
Figure 1C:
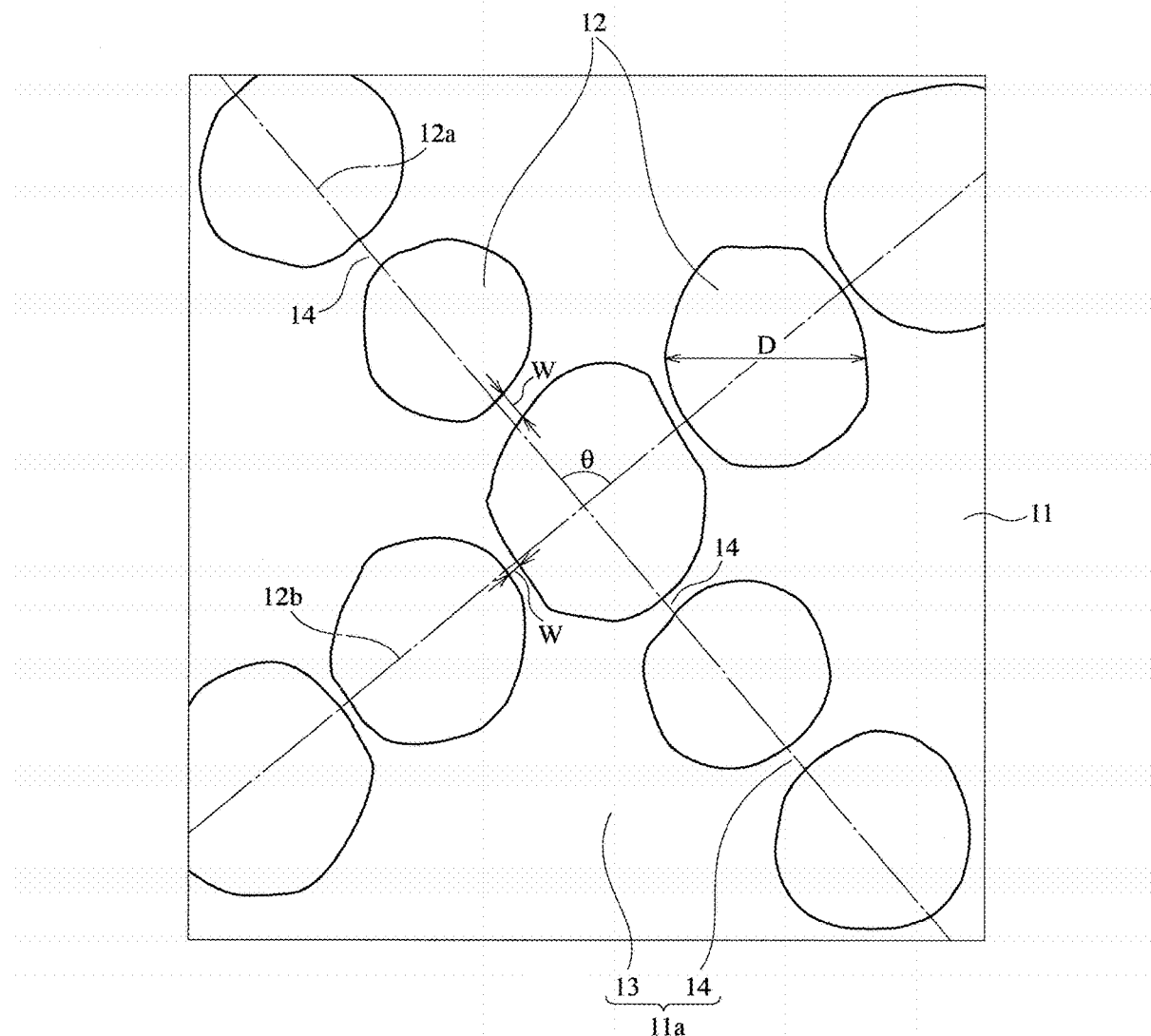
FIG. 1(c) is a partial, enlarged view of FIG. 1.

FIGS. 1(a) to 1(c) show an example of arrangements of fine laser-beam-bored holes for forming the near-field electromagnetic wave absorbing film of the present invention. A thin metal film provided with large numbers of fine laser-beam-bored holes is hereinafter called "bored thin metal film." This bored thin metal film 1 is obtained by forming holes 12 in two crossing lines by laser beams in the single- or multi-layer, thin metal film 11 formed on a surface of the plastic film 10.

(1) Plastic Film

Resins forming the plastic film 10 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. From the aspect of strength and cost, polyethylene terephthalate (PET) is preferable. The thickness of the plastic film 10 may be about 10-100 μm.

(2) Thin Metal Film

Metals forming the thin metal film 11 are not particularly restrictive as long as they have conductivity, and they are preferably aluminum, copper, silver, tin, nickel, cobalt, chromium and their alloys, particularly aluminum, copper, nickel and their alloys, from the aspect of corrosion resistance and cost. The thickness of the thin metal film is preferably 10-300 nm, more preferably 20-200 nm, most preferably 30-150 nm. The thin metal film 11 can be formed by vapor deposition (physical vapor deposition such as vacuum vapor deposition, sputtering or ion plating, or chemical vapor deposition such as plasma CVD, thermal CVD or photo-CVD), plating, or foil bonding.

When the thin metal film 11 is a single layer, thin metal film 11 is preferably made of aluminum or nickel from the aspect of conductivity, corrosion resistance and cost. When the thin metal film 11 is a composite layer, one layer may be formed by a non-magnetic metal, and the other layer may be formed by a magnetic metal. The non-magnetic metal may be aluminum, copper, silver, tin or their alloys, and the magnetic metal may be nickel, cobalt, chromium or their alloys. The thickness of the non-magnetic metal layer and the thickness of the magnetic metal layer are not restrictive as long as their total thickness is within the above range.

(3) Laser-Beam-Bored Holes

As shown in FIGS. 1(a) to 1(c), each laser-beam-bored hole 12 is a substantially circular hole formed by evaporating a metal by the irradiation of a laser beam to the thin metal film 11, without opening the plastic film 10. The diameter D of each laser-beam-bored hole 12 is 200 μm or less. When the diameter D is more than 200 μm, the number of laser-beam-bored holes 12 formed in a unit area is too small, resulting in too large portions of the thin metal film 11 remaining between the laser-beam-bored holes 12, which act as a reflecting film, and thus failing to obtain sufficient electromagnetic wave absorbability. The diameter D of each laser-beam-bored hole 12 is preferably 100 μm or less, more preferably 20-100 μm.

In the depicted example, the laser-beam-bored holes 12 are arranged in two crossing lines in the thin metal film 11.

The thin metal film 11 is partitioned to individual main remaining portions 13 by crossing lines 12a, 12b of laser-beam-bored holes. Because the laser-beam-bored holes 12 are arranged with at least partial intervals, interval portions of the thin metal film 11 remain as narrow bridge-like portions 14. Accordingly, thin metal film portions 11a remaining after forming the laser-beam-bored holes 12, which are called "remaining thin metal film portions," consist of the main remaining portions 13 and the narrow bridge-like portions 14.

The laser-beam-bored holes 12 are preferably arranged with intervals in both lines 12a, 12b. The intervals W of adjacent laser-beam-bored holes 12 (widths of bridge-like portions 14) are 50 µm or less. When the intervals W are more than 50 µm, the bored thin metal film 1 does not have desired electric resistance. The intervals W of adjacent laser-beam-bored holes 12 (widths of bridge-like portions 14) are preferably 20 µm or less, more preferably 1-15 µm. Accordingly, the maximum width Wmax of bridge-like portions 14 is 50 µm, preferably 20 µm. The average width Wav of bridge-like portions 14 is 3-30 µm, preferably 5-20 µm.

Though laser beam spots per se are circular, regions of the thin metal film 1 evaporated by laser beams are not completely circular, but tend to have slightly irregular contours due to interference between adjacent laser-beam-bored holes 12. For example, when there is no space between adjacent laser-beam-bored holes 12, both laser-beam-bored holes 12, 12 are not in contact, but may have bridge-like portions 14 with small widths. This seems to be due to the fact that an evaporated metal is solidified between adjacent laser beam spots, resulting in narrow bridge-like portions 14. Thus, even with laser beam spots arranged with the same interval, laser-beam-bored holes 12 actually formed by the evaporation of the thin metal film 11 do not have the same interval, but the bridge-like portions 14 have different widths W within a range of 50 µm or less. Accordingly, the near-field electromagnetic wave absorbing film of the present invention has excellent electromagnetic wave absorbability in a wide range of frequency.

The lines 12a, 12b of laser-beam-bored holes are crossing at an angle θ of 45-90°, thereby providing high electromagnetic wave absorbability with low anisotropy. When the crossing angle θ is less than 45°, sufficient electromagnetic wave absorbability cannot be obtained. The crossing angle θ of 90° provides the maximum electromagnetic wave absorbability. The preferred crossing angle θ is 60-90°.

The size of main remaining portions 13 largely depends on the centerline distance T between adjacent laser-beam-bored holes lines 12a, 12b. Because the size of main remaining portions 13 affects the electric resistance (thus, electromagnetic wave absorbability) of the near-field electromagnetic wave absorbing film 20, the centerline distance T between adjacent lines 12a, 12b of laser-beam-bored holes should be set to have desired electric resistance. Specifically, the centerline distance T between adjacent lines 12a, 12b of laser-beam-bored holes is preferably 100-400 µm, more preferably 150-300 µm.

Figure 2:
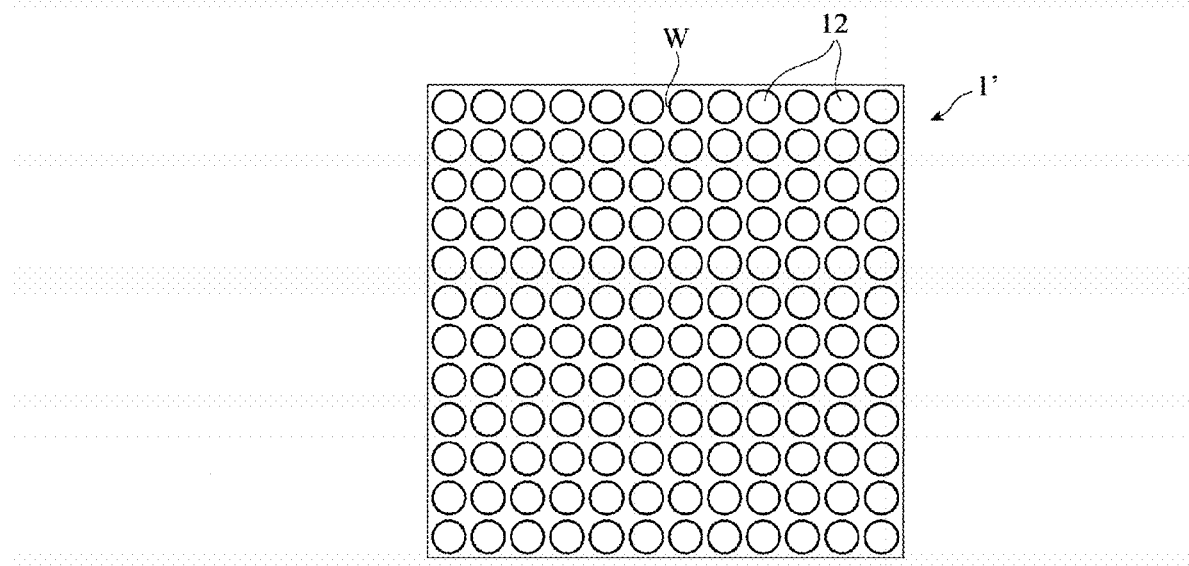
FIG. 2 is a partial, enlarged plan view showing another example of arrangements of fine laser-beam-bored holes for forming the near-field electromagnetic wave absorbing film of the present invention.

FIG. 2 shows another example of arrangements of fine laser-beam-bored holes for forming the near-field electromagnetic wave absorbing film of the present invention. In this bored thin metal film 1', pluralities of laser-beam-bored holes 12 are arranged with substantially the same interval W in both vertical directions. As in the above example, the interval W is 50 µm or less, preferably 20 µm or less, more preferably 1-15 µm.

(4) Openings

Pluralities of openings as large as giving transmission viewability are partially formed in the bored thin metal film, to produce a near-field electromagnetic wave absorbing film. The shapes and arrangements of openings are not restrictive, as long as necessary transmission viewability is obtained while securing sufficient electromagnetic wave absorbability. The sizes of openings are also not restrictive, as long as necessary transmission viewability is obtained while securing sufficient electromagnetic wave absorbability, though they preferably have diameters of several millimeters to several tens of millimeters, for example, when they are circular as shown in FIG. 2. In general, the openings are preferably as large as 2-20 mm in diameter or width. FIGS. 3-9 show examples of the shapes, sizes and arrangements of openings. Though the openings may be arranged in one direction, they are arranged preferably in at least two directions.

Figure 3:
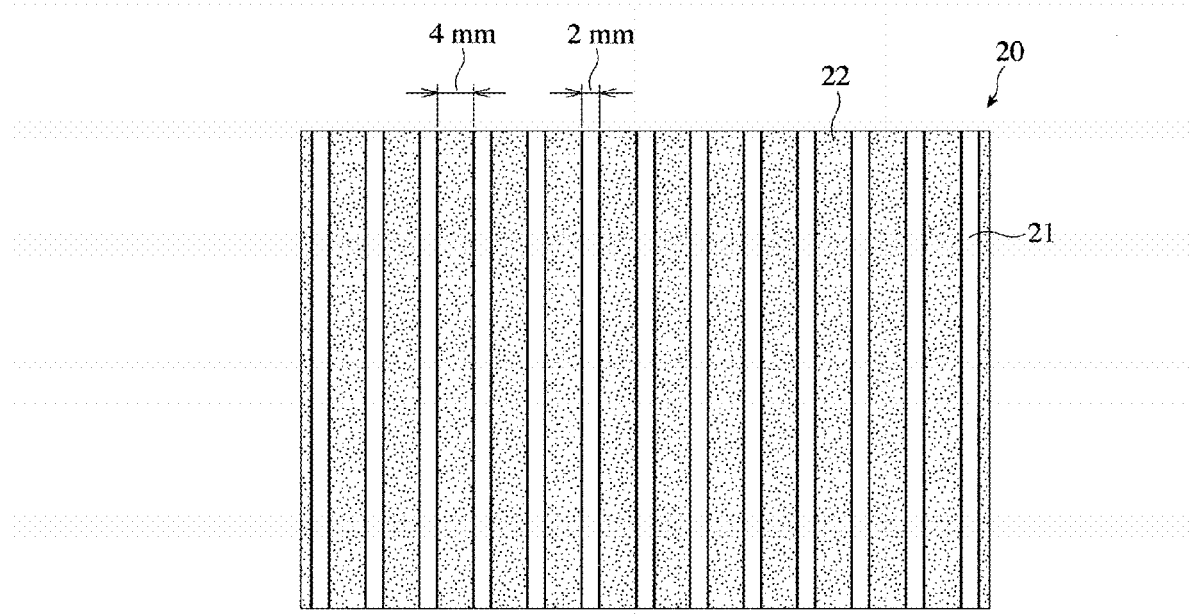
FIG. 3 is a plan view showing an example of arrangements of openings for forming the near-field electromagnetic wave absorbing film of the present invention.

In the near-field electromagnetic wave absorbing film 20 shown in FIG. 3, pluralities of parallel slit-like openings 21 are formed in the bored thin metal film 1. Thin metal film portions remaining 22 after forming the slit-like openings 21, which may be called post-opening remaining portions, are in a ribbon shape.

Figure 4:
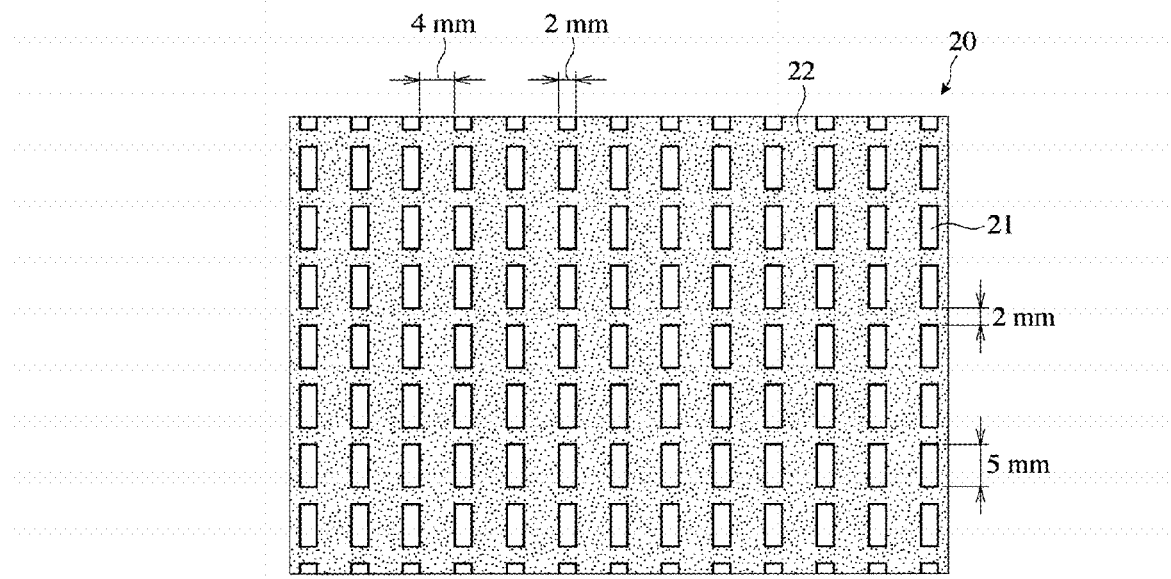
FIG. 4 is a plan view showing another example of arrangements of openings for forming the near-field electromagnetic wave absorbing film of the present invention.

In the near-field electromagnetic wave absorbing film 20 shown in FIG. 4, pluralities of rectangular openings 21 are formed in parallel longitudinally and transversely in the bored thin metal film 1. Thin metal film portions remaining 22 after forming the rectangular openings 21, which may be called post-opening remaining portions, are in a lattice shape.

Figure 5:
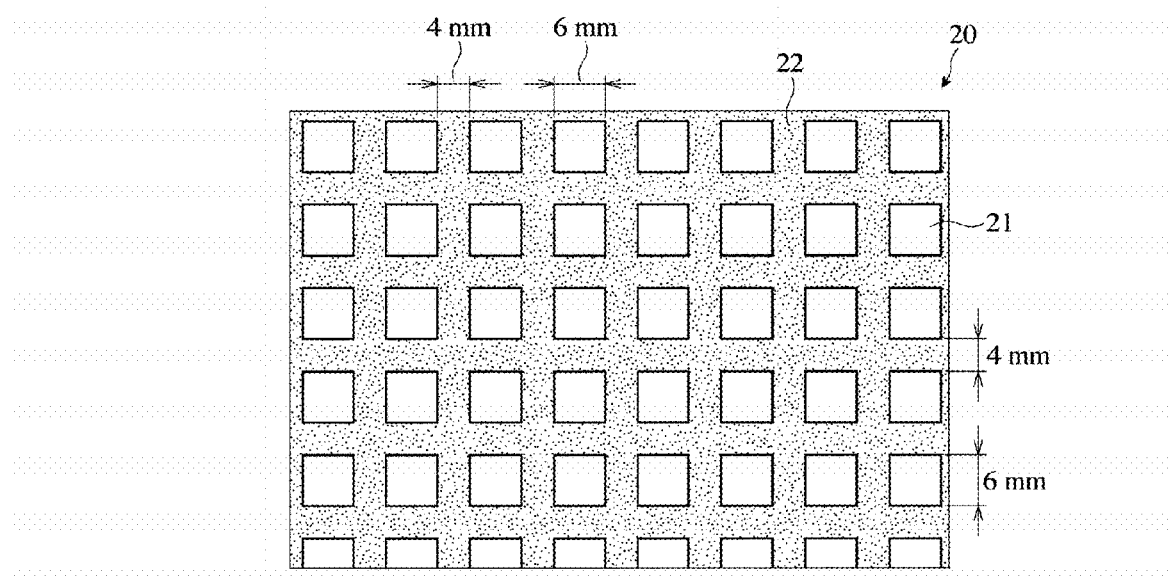
FIG. 5 is a plan view showing a further example of arrangements of openings for forming the near-field electromagnetic wave absorbing film of the present invention.

In the near-field electromagnetic wave absorbing film 20 shown in FIG. 5, pluralities of square openings 21 are formed in parallel longitudinally and transversely in the bored thin metal film 1. Thin metal film portions remaining 22 after forming the square openings 21, which may be called post-opening remaining portions, are in a lattice shape.

Figure 6:
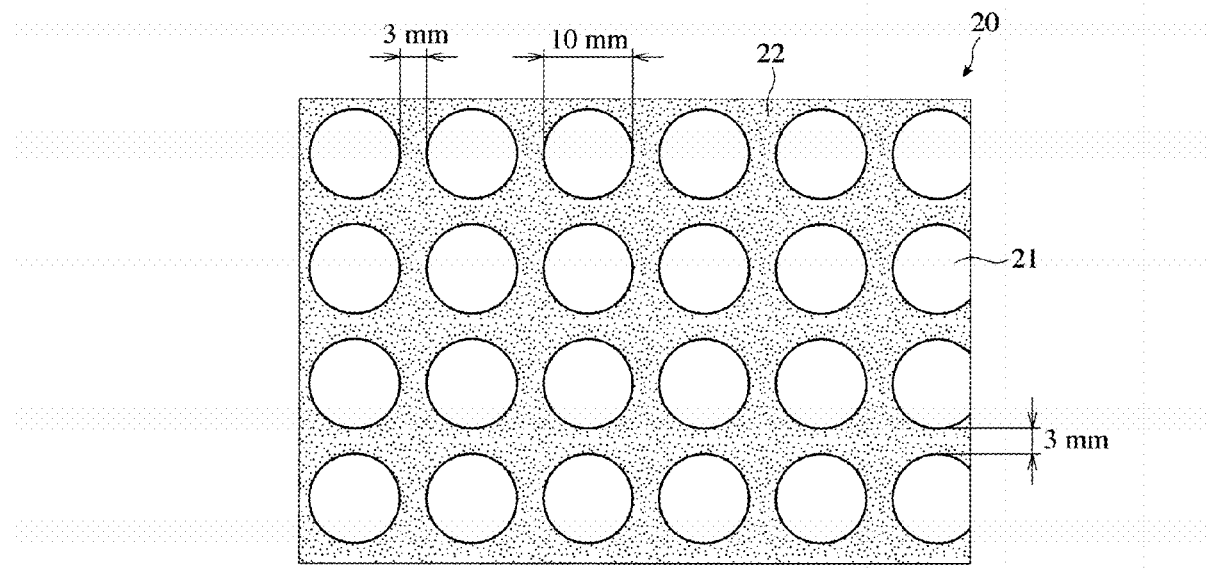
FIG. 6 is a plan view showing a still further example of arrangements of openings for forming the near-field electromagnetic wave absorbing film of the present invention.

In the near-field electromagnetic wave absorbing film 20 shown in FIG. 6, pluralities of circular openings 21 are formed in parallel longitudinally and transversely in the bored thin metal film 1. Thin metal film portions remaining 22 after forming the circular openings 21, which may be called post-opening remaining portions, are in a lattice shape.

Figure 7:
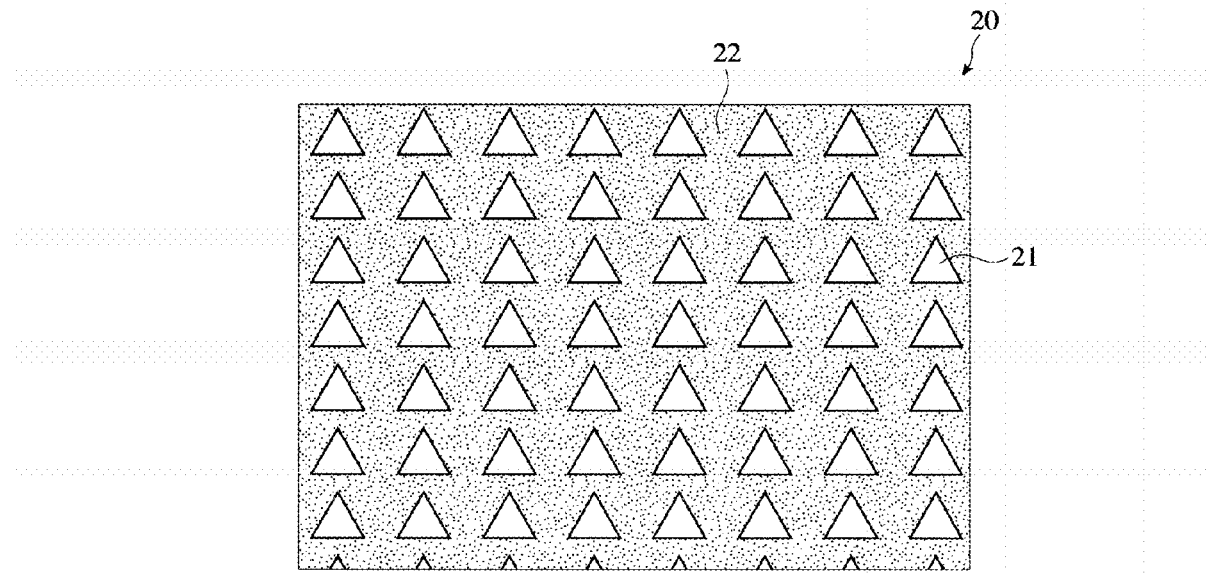
FIG. 7 is a plan view showing a still further example of arrangements of openings for forming the near-field electromagnetic wave absorbing film of the present invention.

In the near-field electromagnetic wave absorbing film 20 shown in FIG. 7, pluralities of triangular openings 21 are formed in parallel longitudinally and transversely in the bored thin metal film 1. Thin metal film portions remaining 22 after forming the triangular openings 21, which may be called post-opening remaining portions, are in a deformed lattice shape.

Figure 8:
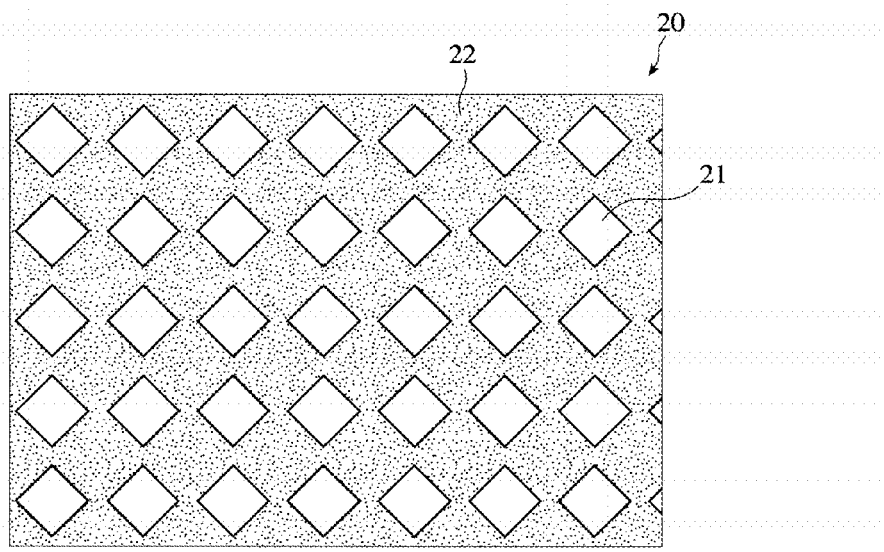
FIG. 8 is a plan view showing a still further example of arrangements of openings for forming the near-field electromagnetic wave absorbing film of the present invention.

In the near-field electromagnetic wave absorbing film 20 shown in FIG. 8, pluralities of rhombic openings 21 are formed in parallel longitudinally and transversely in the bored thin metal film 1. Thin metal film portions remaining 22 after forming the rhombic (inclined square) openings 21, which may be called post-opening remaining portions, are in a deformed lattice shape.

Figure 9:
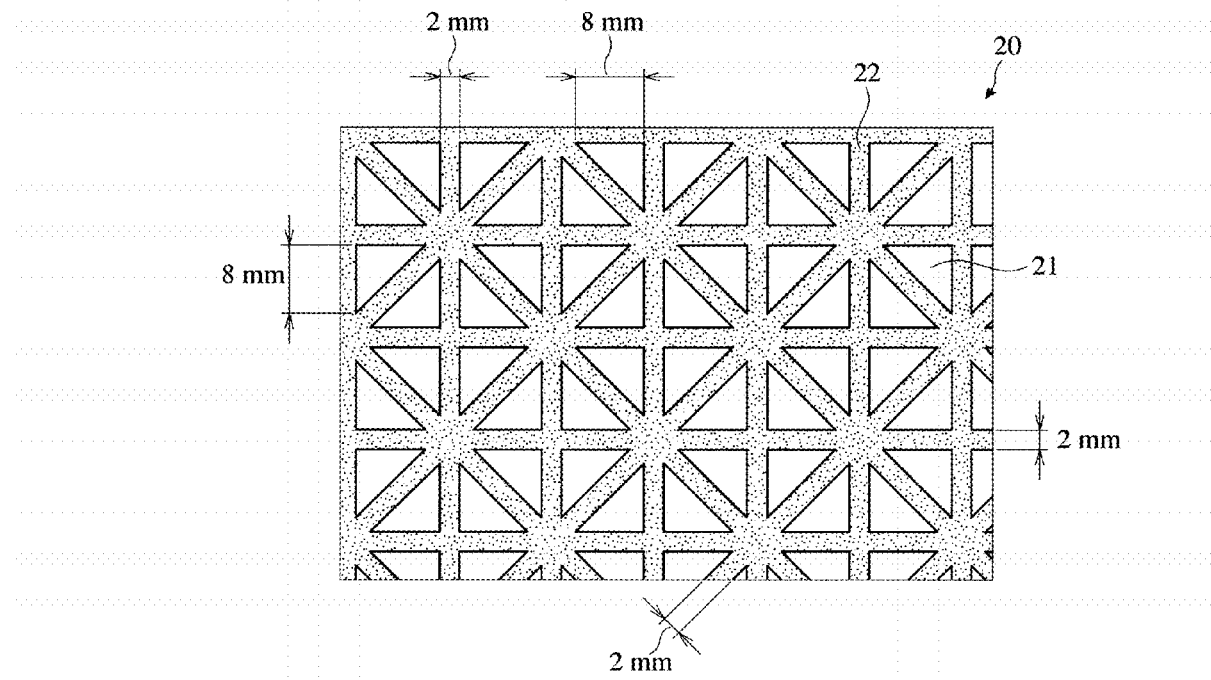
FIG. 9 is a plan view showing a still further example of arrangements of openings for forming the near-field electromagnetic wave absorbing film of the present invention.

In the near-field electromagnetic wave absorbing film 20 shown in FIG. 9, plural pairs of triangular openings 21 are formed in parallel longitudinally and transversely in the bored thin metal film 1. Thin metal film portions remaining 22 after forming the triangular openings 21, which may be called post-opening remaining portions, are in a deformed lattice shape.

As shown in FIGS. 3-9, the post-opening remaining portions 22 should be connected in at least one direction, preferably in at least two directions. The area ratio of openings 21 to the bored thin metal film 1 [100×total area of openings 21/(total area of openings 21+total area of post-opening remaining portions 22)] is preferably 15-60%, more preferably 20-50%. When the area ratio of openings 21 is less than 15%, sufficient transmission viewability cannot be obtained. On the other hand, when the area ratio of openings 21 is more than 60%, sufficient electromagnetic wave absorbability cannot be secured.

(4) Electric Resistance

The electromagnetic wave absorbability of the near-field electromagnetic wave absorbing film 20 basically depends on the electromagnetic wave absorbability of the bored thin metal film 1. Intensive research has revealed that the electromagnetic wave absorbability of the bored thin metal film 1 depends on the sizes and electric resistance of bored thin metal film portions 11a remaining after forming the laser-beam-bored holes 12 (remaining bored thin metal film portions 11a=bored main remaining portions 13+bored bridge-like portions 14). The bored thin metal film 1 having electric resistance of 50-300 $\Omega$/100 cm$^2$ has excellent electromagnetic wave absorbability in a wide range of frequency.

Figure 10A:
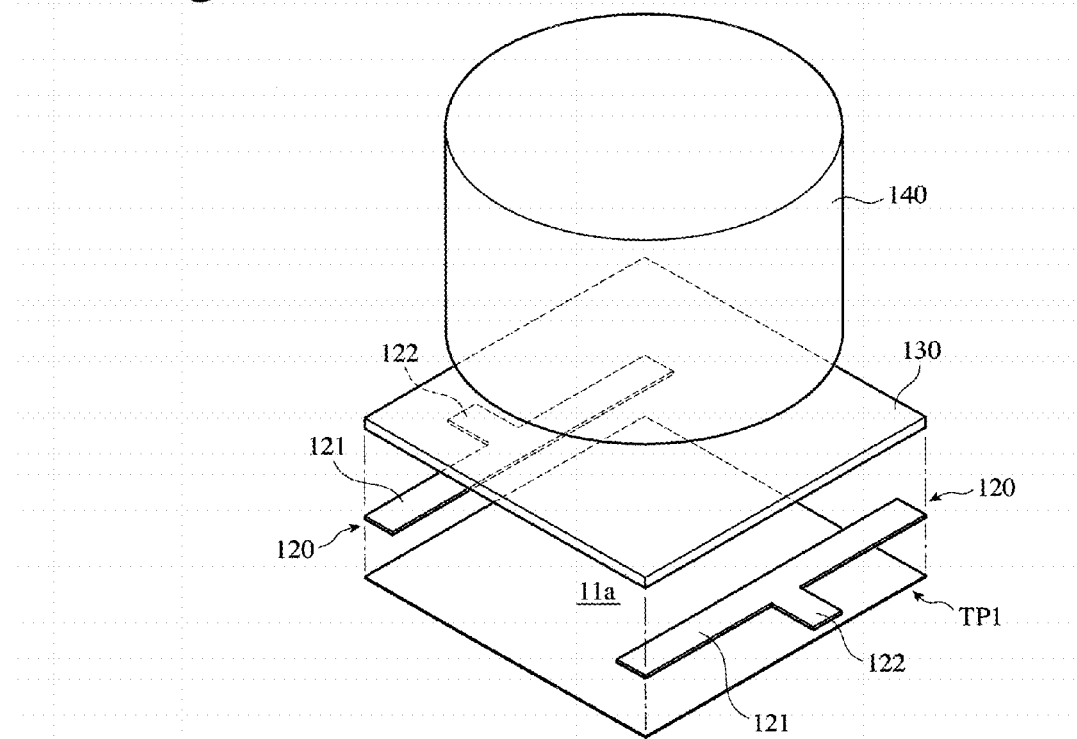
FIG. 10(a) is a perspective view showing an apparatus for measuring the electric resistance of a near-field electromagnetic wave absorbing film.
Figure 10B:
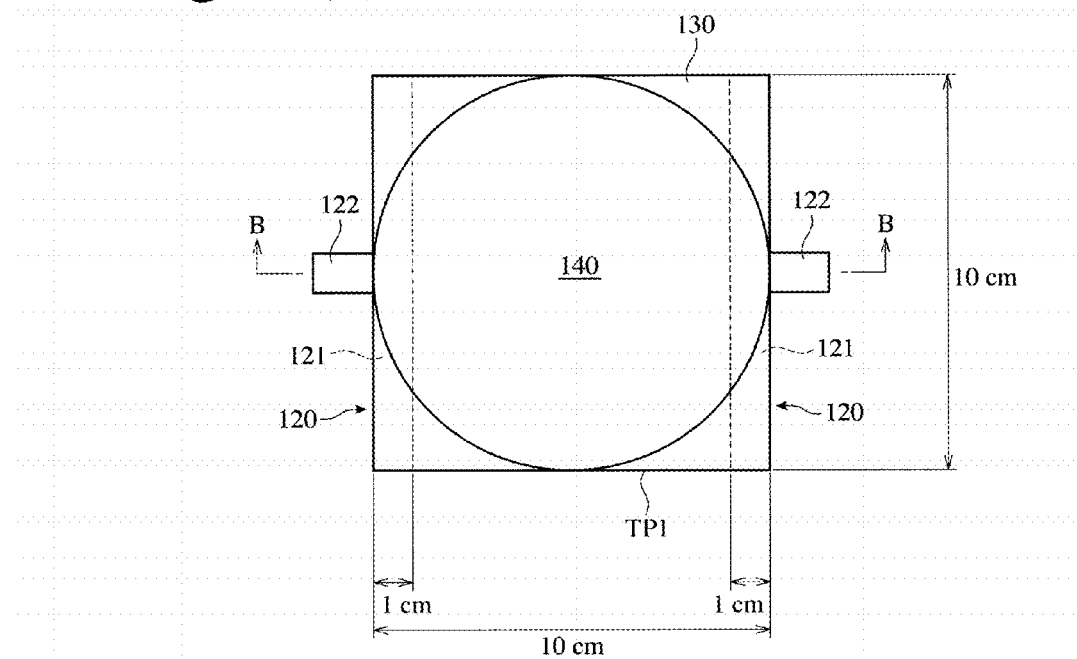
FIG. 10(b) is a plan view showing the measurement of the electric resistance of a near-field electromagnetic wave absorbing film by the apparatus of FIG. 10(a).
Figure 10C:
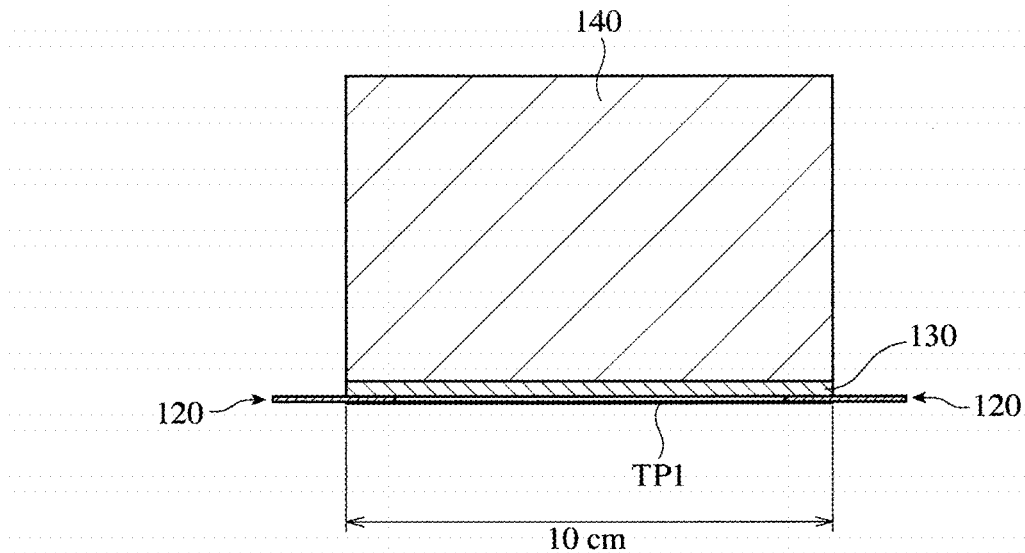
FIG. 10(c) is a cross-sectional view taken along the line B-B in FIG. 10(b).

The electric resistance of the bored thin metal film 1 is measured by a DC two-terminal method under pressure (simply called "under-pressure two-terminal method"), using an apparatus shown in FIGS. 10(a) to 10(c), to which a test piece TP1 of a composite film comprising a bored thin metal film 1 on a surface of a plastic film 10. Specifically, a square test piece TP1 of 10 cm×10 cm is placed with its bored thin metal film 1 above on a flat, hard insulation surface, a pair of electrodes 120, 120 each comprising an electrode body portion 121 of 10 cm in length, 1 cm in width and 0.5 mm in thickness, and an electrode extension 122 of 1 cm in width and 0.5 mm in thickness extending from a center side of the electrode body portion 121 are attached to opposing side portions of the square test piece TP1. A transparent acrylic plate 130 of 10 cm×10 cm×5 mm is placed on the test piece TP1 and both electrodes 120, 120, such that it completely covers them, and a cylindrical weight 140 (3.85 kg) of 10 cm in diameter is placed on the transparent acrylic plate 130, to measure current flowing between both electrode extensions 222, 222 to determine the electric resistance. The electric resistance measured under the above conditions is expressed by "$\Omega$/100 cm$^2$."

The bored thin metal film 1 (near-field electromagnetic wave absorbing film 20) should have electric resistance in a range of 50-300 $\Omega$/100 cm$^2$. When the electric resistance is less than 50 $\Omega$/100 cm$^2$ or more than 300 $\Omega$/100 cm$^2$, the near-field electromagnetic wave absorbing film 20 does not have sufficient electromagnetic wave absorbability. The electric resistance of the near-field electromagnetic wave absorbing film 20 is preferably 60-250 $\Omega$/100 cm$^2$, more preferably 80-200 $\Omega$/100 cm$^2$.

(5) Protective Layer

To protect the bored thin metal film 1, a protective plastic layer (not shown) is preferably formed thereon. A plastic film for the protective plastic layer may be the same as the plastic film 10. The thickness of the protective plastic layer is preferably about 10-100 μm. To prevent detachment, a plastic film is preferably heat-laminated to the near-field electromagnetic wave absorbing film 20 as a protective layer. When the protective plastic layer is formed by a PET film, the heat lamination temperature may be 110-150° C.

Though a plastic film for the protective layer is usually attached to the near-field electromagnetic wave absorbing film 20 after laser-beam-bored holes and openings are formed in the thin metal film 11 on the plastic film 10, the laser-beam-bored holes and the openings may be formed after the protective plastic film is attached to the thin metal film 11, as long as the protective plastic film is provided with a lot of fine pores in advance. The formation of fine pores in the protective plastic film can be conducted by the method described in Japanese Patent 2063411.

Figure 11A:
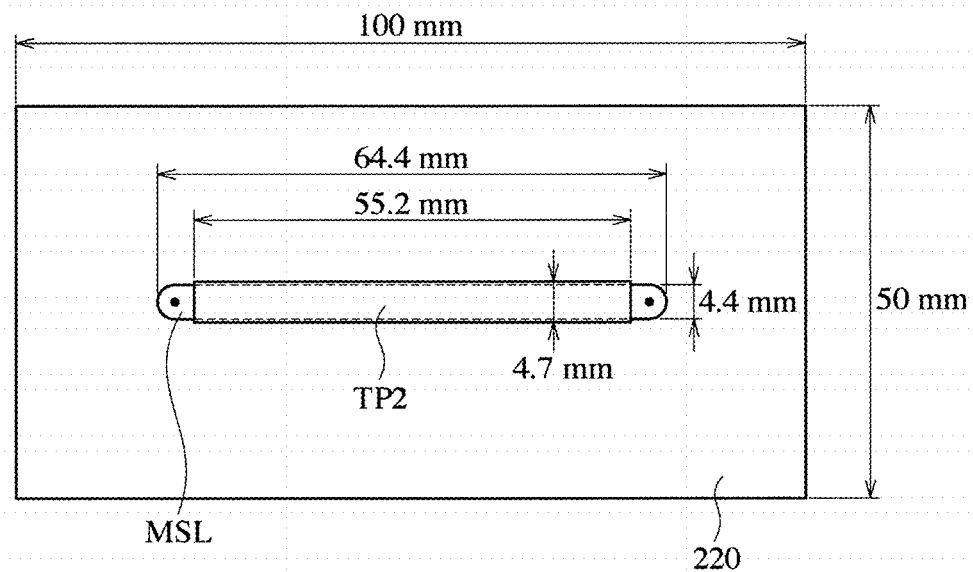
FIG. 11(a) is a plan view showing a system for evaluating the electromagnetic wave absorbability of a near-field electromagnetic wave absorbing film.
Figure 11B:
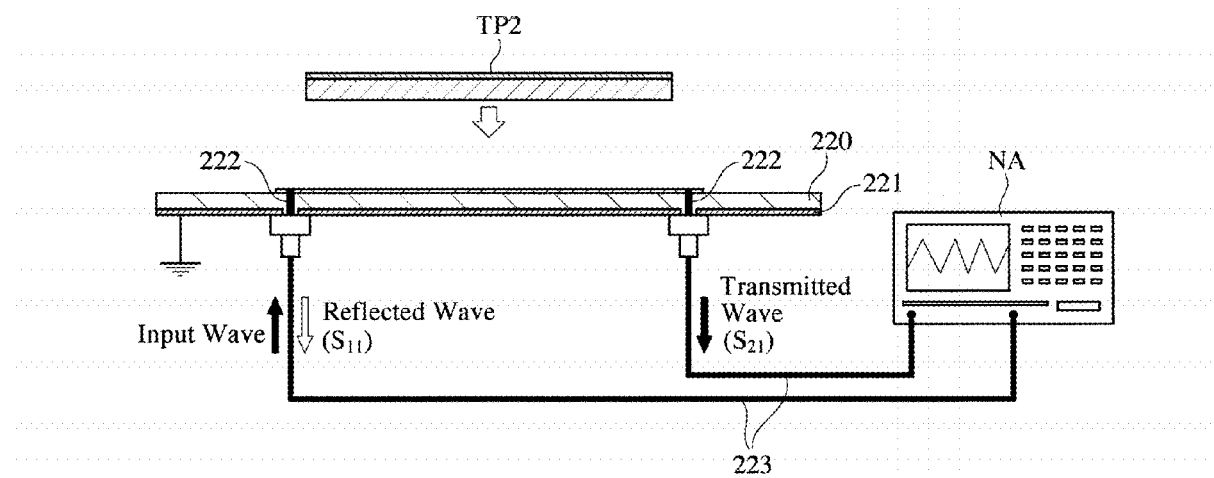
FIG. 11(b) is a partially cross-sectional front view showing a system for evaluating the electromagnetic wave absorbability of a near-field electromagnetic wave absorbing film.

[2] Electromagnetic Wave Absorbability of Near-Field Electromagnetic Wave Absorbing Film (1) Transmission Attenuation Power Ratio Using a system comprising a 50-$\Omega$ microstripline MSL (64.4 mm×4.4 mm), an insulating substrate 220 supporting the microstripline MSL, a grounded electrode 221 attached to a lower surface of the insulating substrate 220, conductive pins 222, 222 connected to both ends of the microstripline MSL, a network analyzer NA, and coaxial cables 223, 223 connecting the network analyzer NA to the conductive pins 222, 222 as shown in FIGS. 11(a) and 11(b), a test piece TP2 of each near-field electromagnetic wave absorbing film 20 is adhered to the microstripline MSL to measure its reflected wave power $S_{11}$ and transmitted wave power $S_{21}$ to an input electromagnetic wave of 0.1-6 GHz, thereby determining its transmission attenuation power ratio Rtp by the following formula (1):

$$Rtp = -10 \times \log\left[10^{S21/10}/(1-10^{S11/10})\right] \quad (1).$$

(2) Noise Absorption Ratio

In the system shown in FIGS. 11(a) and 11(b), input power $P_{in}$=reflected wave power $S_{11}$+transmitted wave power $S_{21}$+absorbed power (power loss) $P_{loss}$. Accordingly, the noise absorption ratio $P_{loss}/P_{in}$ is determined by subtracting the reflected wave power $S_{11}$ and the transmitted wave power $S_{21}$ from the input power $P_{in}$, and dividing the resultant power loss $P_{loss}$ by the input power $P_{in}$.

[3] Production Method of Near-Field Electromagnetic Wave Absorbing Film

Laser-beam-bored holes 12 of 200 μm or less in diameter are first formed with intervals of 50 μm or less on an entire surface of a thin metal film 11 formed on a plastic film 10 by, for example, vapor deposition. The bored thin metal film 1 is then partially provided with pluralities of openings 21 as large as giving transmission viewability. The openings 21 may be formed by irradiating laser beams. In this case, though the laser-beam-bored holes 12 and the openings 21 can be formed by one irradiation operation of laser beams, the separate formation of laser-beam-bored holes 12 and openings 21 by two steps can produce the near-field electromagnetic wave absorbing film 20 with higher efficiency. Incidentally, the openings 21 may be formed by photolithography.

The present invention will be explained in more detail referring to Examples below without intention of restriction.

Reference Example 1, and Comparative Examples 1 and 2

Figure 12:
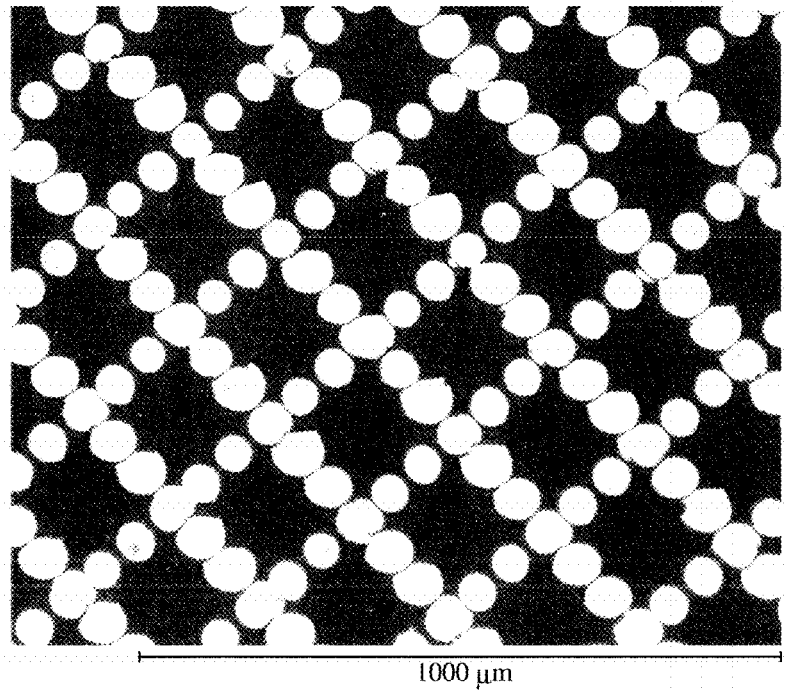
FIG. 12 is a photomicrograph showing the bored composite film of Reference Example 1.
Figure 13:
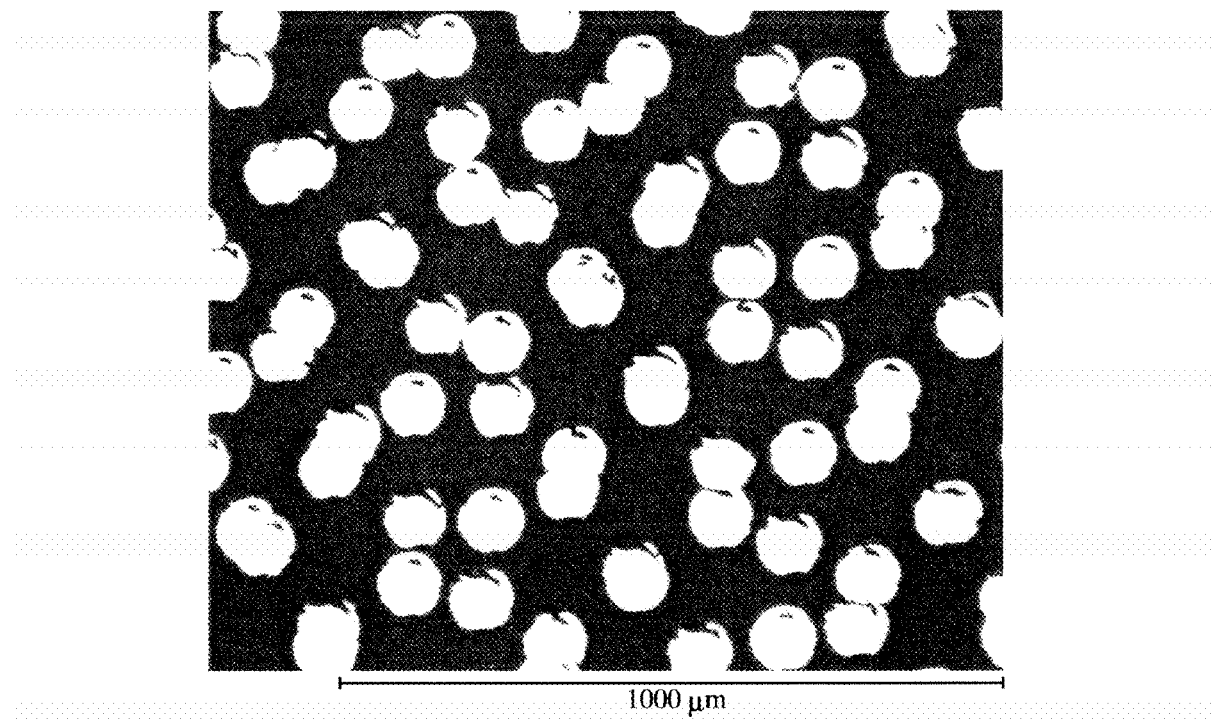
FIG. 13 is a photomicrograph showing the bored composite film of Comparative Example 1.
Figure 14:
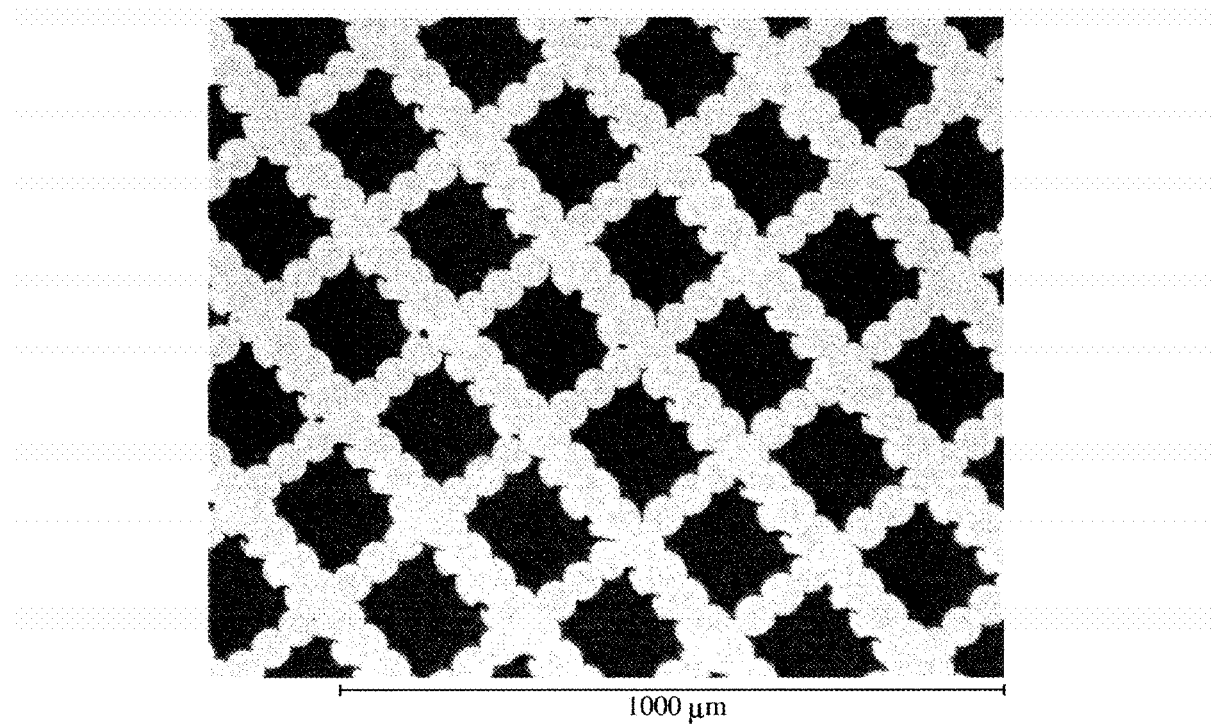
FIG. 14 is a photomicrograph showing the bored composite film of Comparative Example 2.

A thin Ni film 11 as thick as 50 μm, which was vacuum-vapor-deposited on each PET film 10 as thick as 16 μm, was provided with laser-beam-bored holes 12 of 60 μm in diameter in two crossing lines by a 3-Axis hybrid laser marker (MD-X1000 available from Keyence Corporation), to produce a composite film having a bored thin Ni film 1 shown in FIGS. 12-14. The electric resistance of a square test piece TP1 (10 cm×10 cm) cut out of each composite film was measured by the method described in Section [1] (4).

The results are shown in Table 1.

TABLE 1

|  | No. | | |
| --- | --- | --- | --- |
|  | Ref. Ex. 1 | Com. Ex. 1 | Com. Ex. 2 |
| Corresponding Figure | FIG. 12 | FIG. 13 | FIG. 14 |
| Crossing Angle $\theta^{(1)}$ (°) | 90 | 90 | 90 |
| Maximum Width Wmax (μm) | 15 | 60 | 0 |
| Average Width Wav (μm) | 7 | 50 | 0 |
| Electric Resistance (Ω/100 cm²) | 60 | 6 | ∞ |

Note:
[1] The crossing angle θ of two lines of laser-beam-bored holes.
(2) The width W of bridge-like portions.

Figure 15:
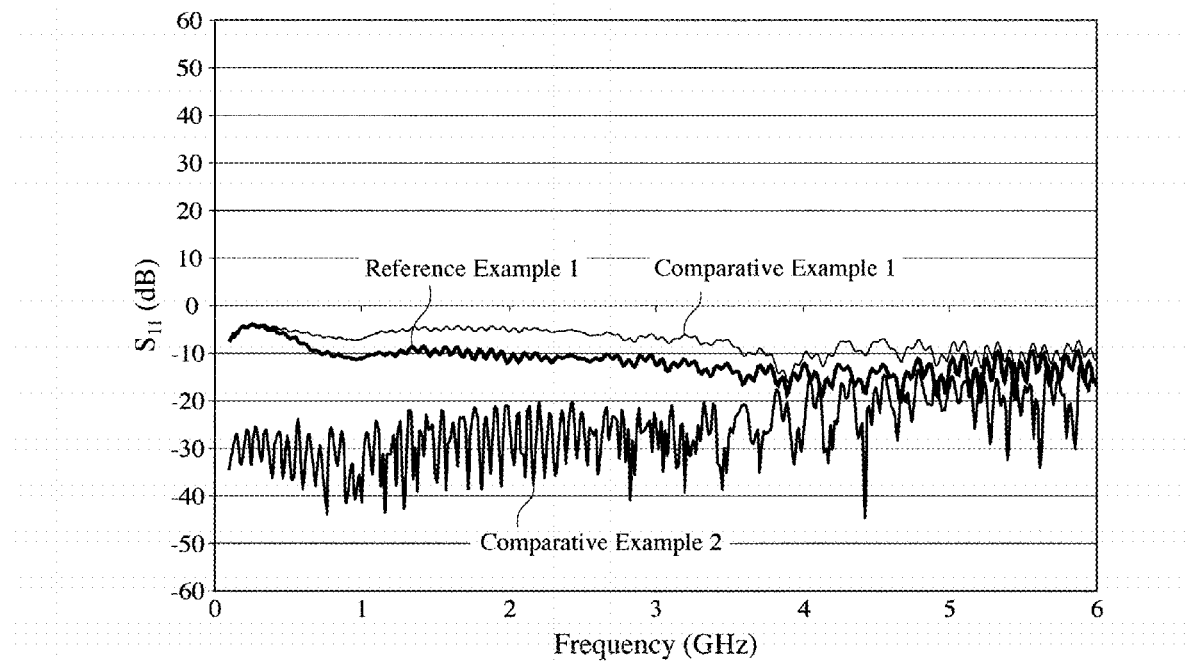
FIG. 15 is a graph showing the relations between $S_{11}$ and the frequency of incident electromagnetic waves in the bored composite films of Reference Example 1 and Comparative Examples 1 and 2.
Figure 16:
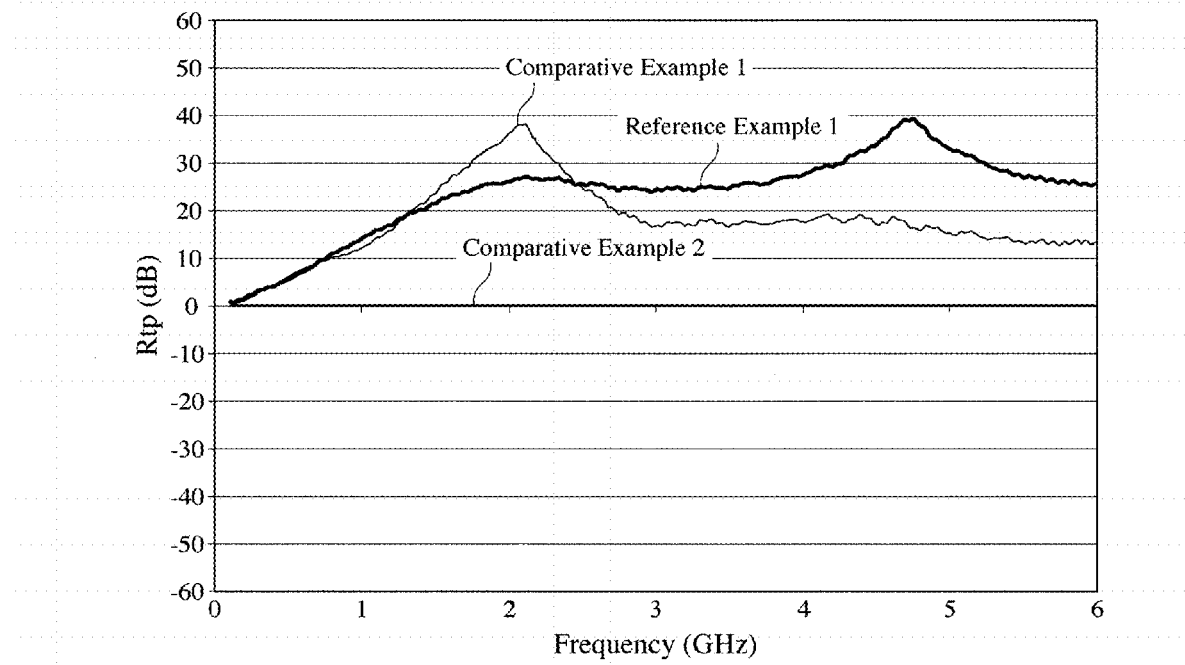
FIG. 16 is a graph showing the relations between transmission attenuation power ratio Rtp and the frequency of incident electromagnetic waves in the bored composite films of Reference Example 1 and Comparative Examples 1 and 2.
Figure 17:
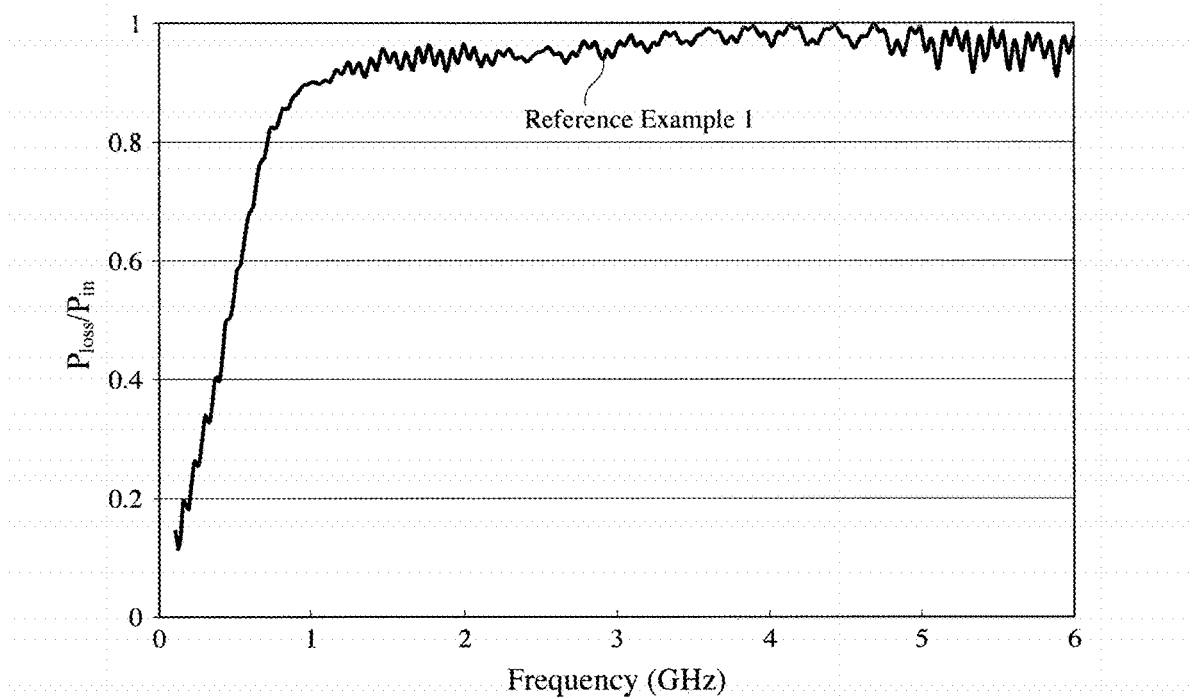
FIG. 17 is a graph showing the $P_{loss}/P_{in}$ of the near-field electromagnetic wave absorbing film of Reference Example 1 at 0.1-6 GHz.

A test piece TP2 (55.2 mm×4.7 mm) cut out of each composite film was adhered to a microstripline MSL in the system shown in FIGS. 11(a) and 11(b), to measure reflected wave power $S_{11}$ and transmitted wave power $S_{21}$ relative to input power $P_{in}$ in a frequency range of 0.1-6 GHz by the method described in Section [2], (1) and (2), thereby determining a transmission attenuation power ratio Rtp and a noise absorption ratio $P_{loss}/P_{in}$ in a frequency range of 0.1-6 GHz. The $S_{11}$, transmission attenuation power ratio Rtp and noise absorption ratio $P_{loss}/P_{in}$ in a frequency range of 0.1-6 GHz are shown in FIGS. 15, 16 and 17, respectively. As is clear from FIG. 15, there was a large reflected wave power $S_{11}$ in Comparative Example 1 having too few laser-beam-bored holes 12 (too low electric resistance). Also, as is clear from FIG. 16, there was a low transmission attenuation power ratio Rtp in Comparative Example 2 having excessive laser-beam-bored holes 12 (too high electric resistance). Further, as is clear from FIG. 17, the composite film of Reference Example 1 had an excellent noise absorption ratio $P_{loss}/P_{in}$.

Reference Example 2

Figure 18:
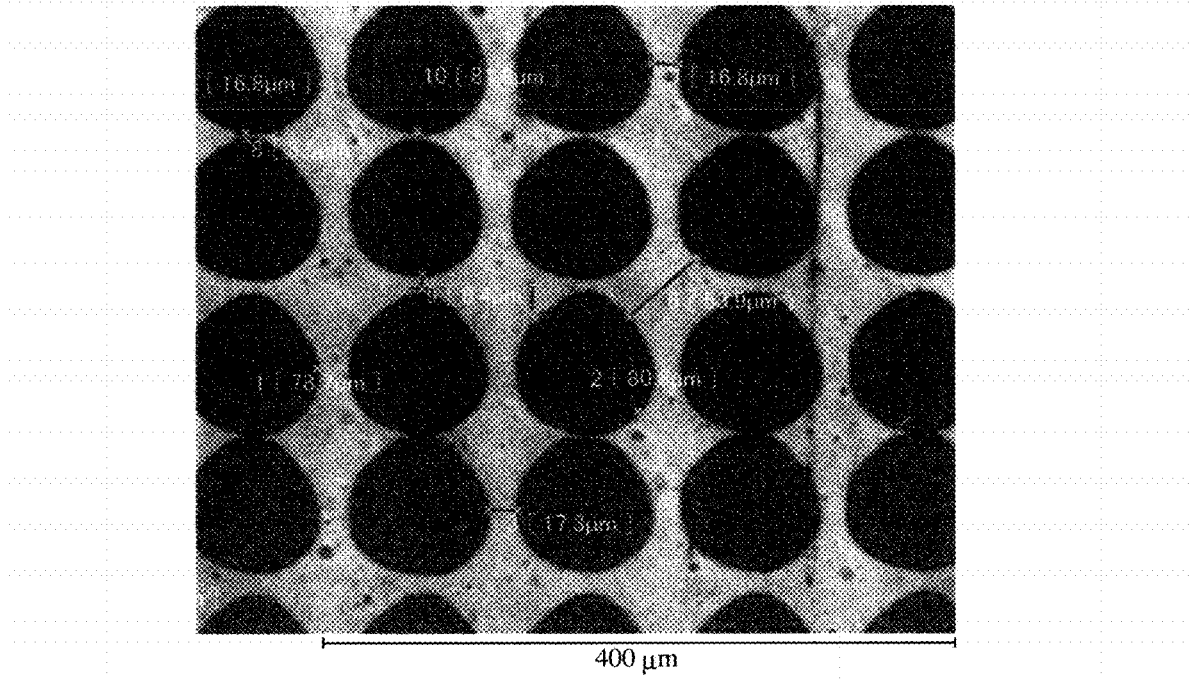
FIG. 18 is a photomicrograph showing the bored composite film of Reference Example 2.

A thin Al film 11 as thick as 80 μm, which was vacuum-vapor-deposited on each PET film 10 as thick as 16 μm, was provided with laser-beam-bored holes 12 of 80 μm in diameter in two crossing lines by a 3-Axis hybrid laser marker (MD-X1000 available from Keyence Corporation), to produce a composite film having a bored thin Al film 1 shown in FIG. 18. The intervals W of the laser-beam-bored holes 12 were about 20 μm. The electric resistance of each composite film measured by the same method as in Reference Example 1 was 60-80 Ω/100 cm².

Figure 19:
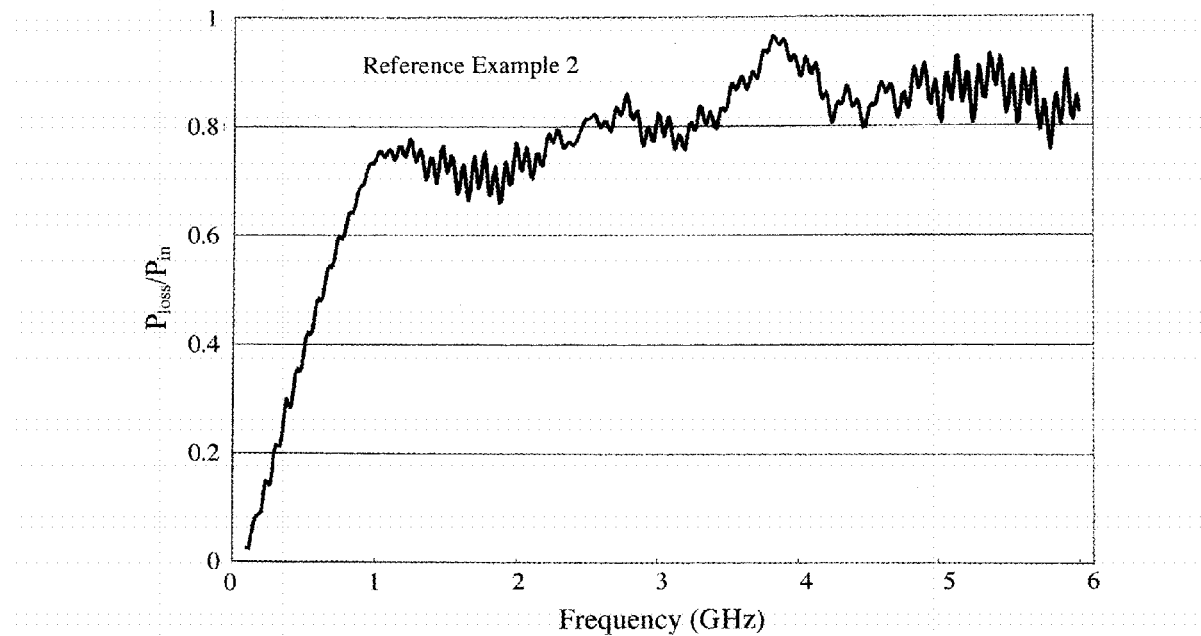
FIG. 19 is a graph showing the $P_{loss}/P_{in}$ of the bored composite film of Reference Example 2 at 0.1-6 GHz.
Figure 20:
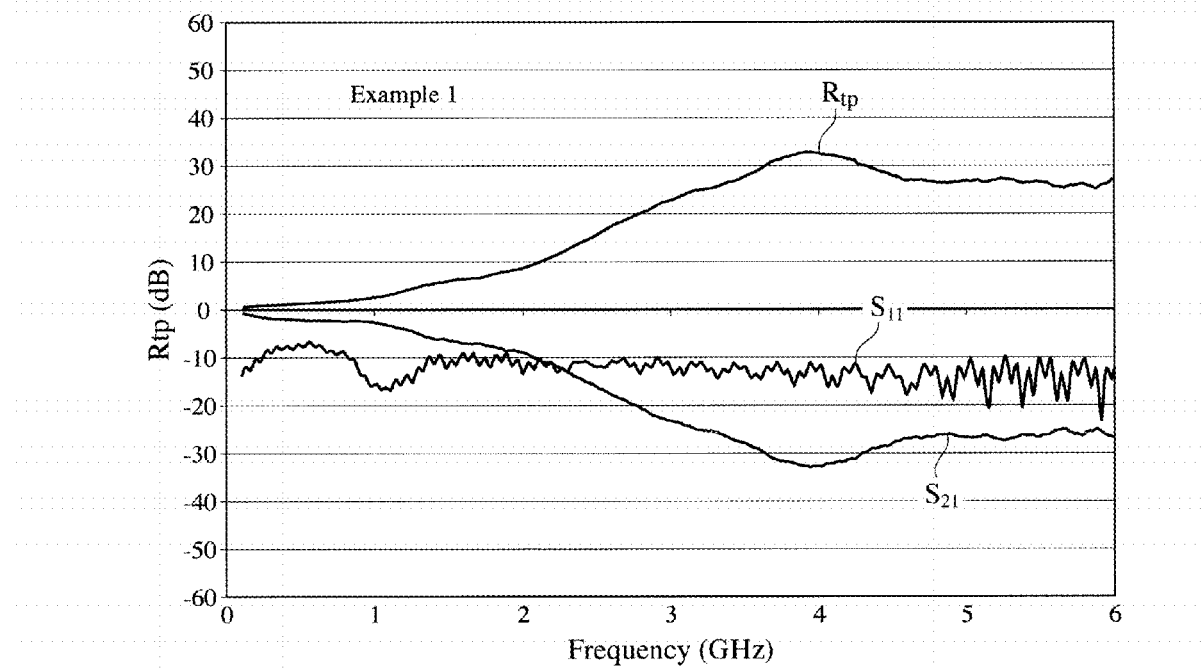
FIG. 20 is a graph showing the $S_{11}$, $S_{21}$ and Rtp of the near-field electromagnetic wave absorbing film of Example 1 at 0.1-6 GHz.
Figure 21:
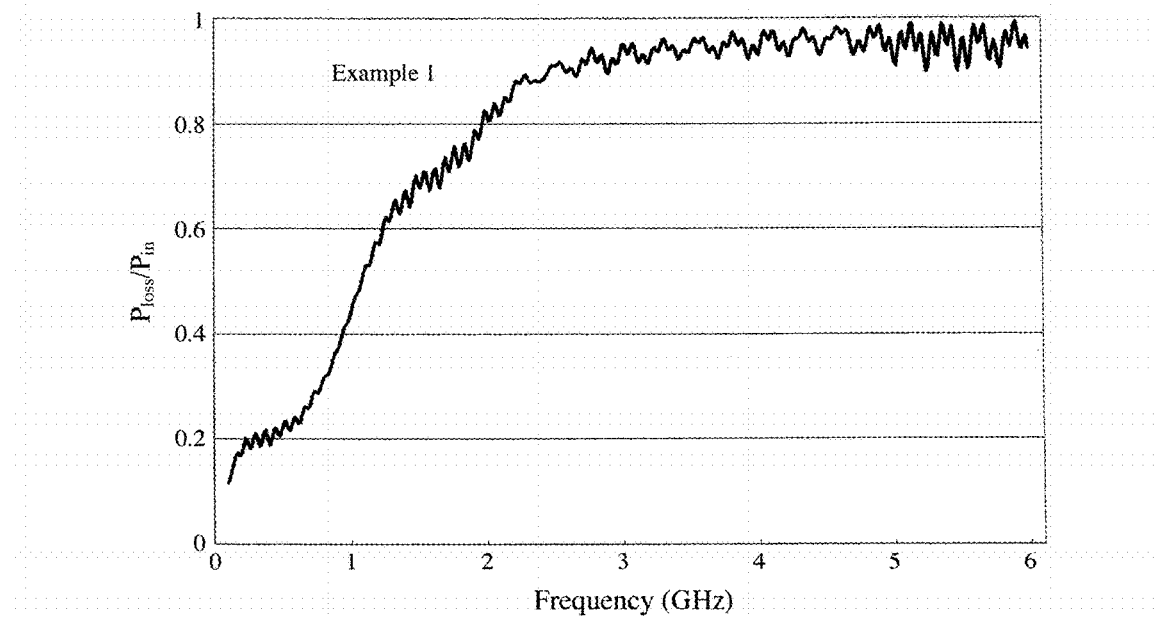
FIG. 21 is a graph showing the $P_{loss}/P_{in}$ of the near-field electromagnetic wave absorbing film of Example 1 at 0.1-6 GHz.
Figure 22:
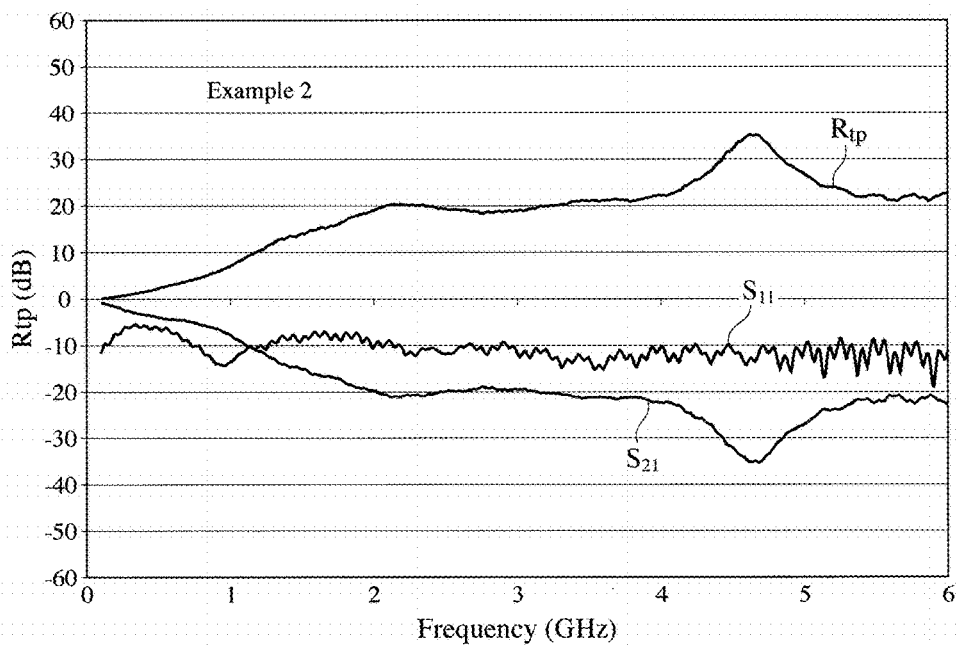
FIG. 22 is a graph showing the $S_{11}$, $S_{21}$ and Rtp of the near-field electromagnetic wave absorbing film of Example 2 at 0.1-6 GHz.
Figure 23:
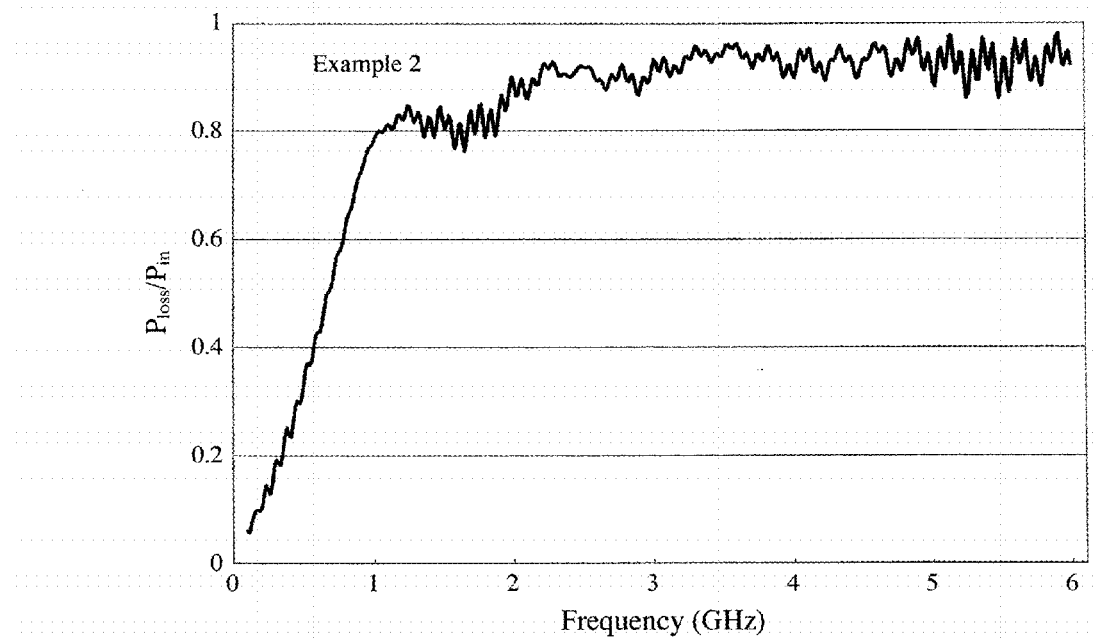
FIG. 23 is a graph showing the $P_{loss}/P_{in}$ of the near-field electromagnetic wave absorbing film of Example 2 at 0.1-6 GHz.
Figure 24:
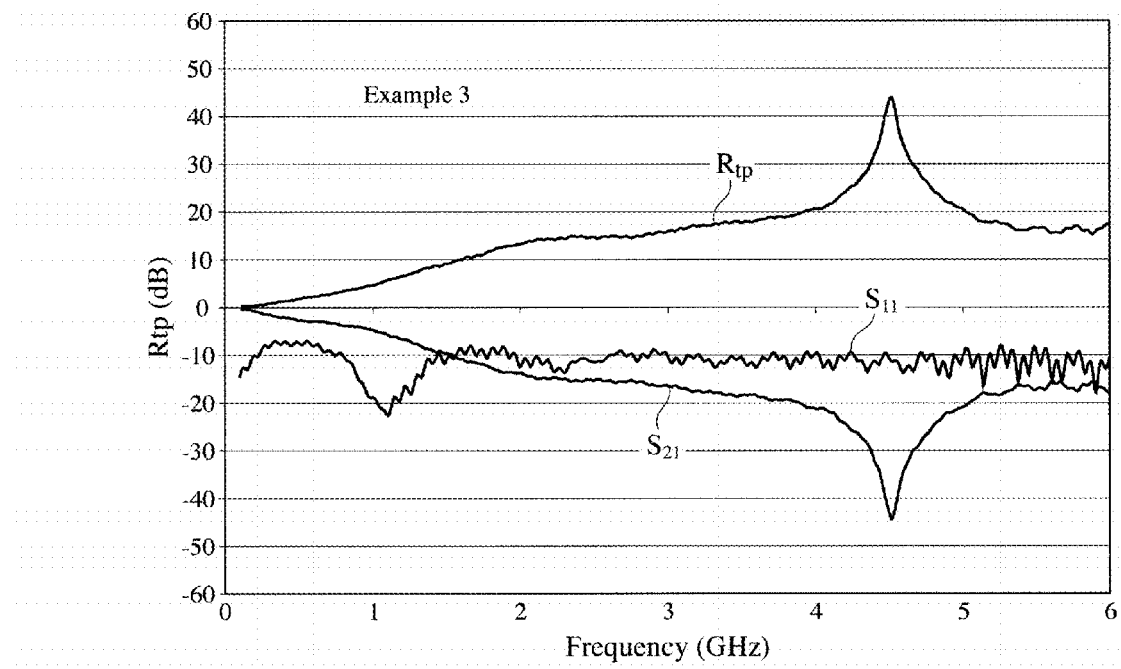
FIG. 24 is a graph showing the $S_{11}$, $S_{21}$ and Rtp of the near-field electromagnetic wave absorbing film of Example 3 at 0.1-6 GHz.
Figure 25:
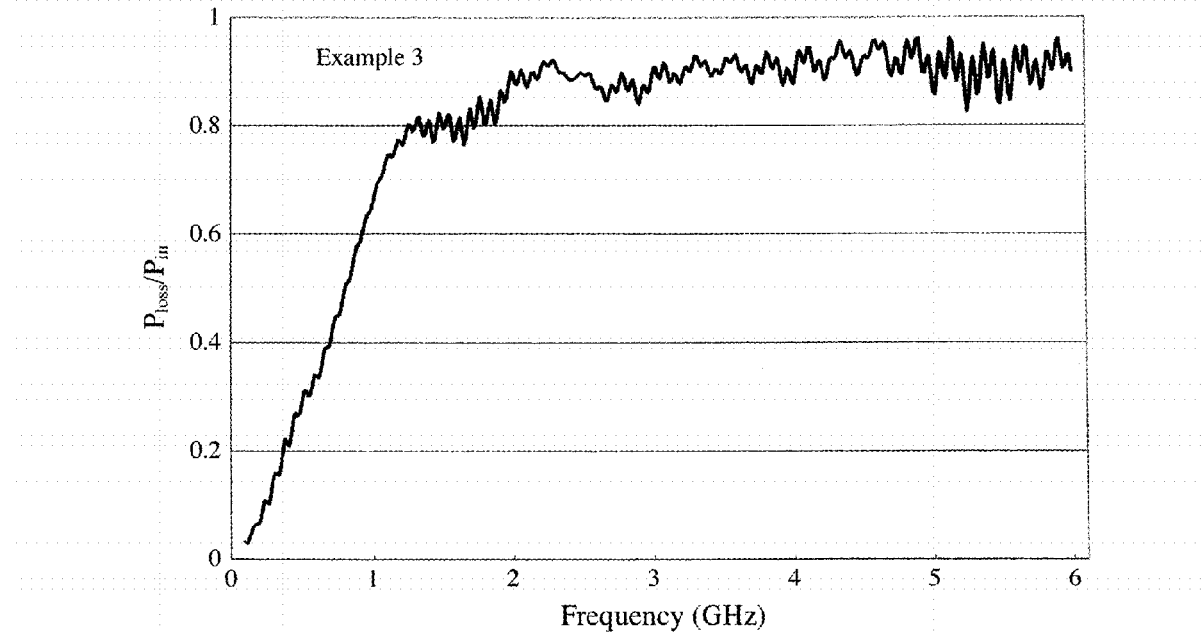
FIG. 25 is a graph showing the $P_{loss}/P_{in}$ of the near-field electromagnetic wave absorbing film of Example 3 at 0.1-6 GHz.
Figure 26:
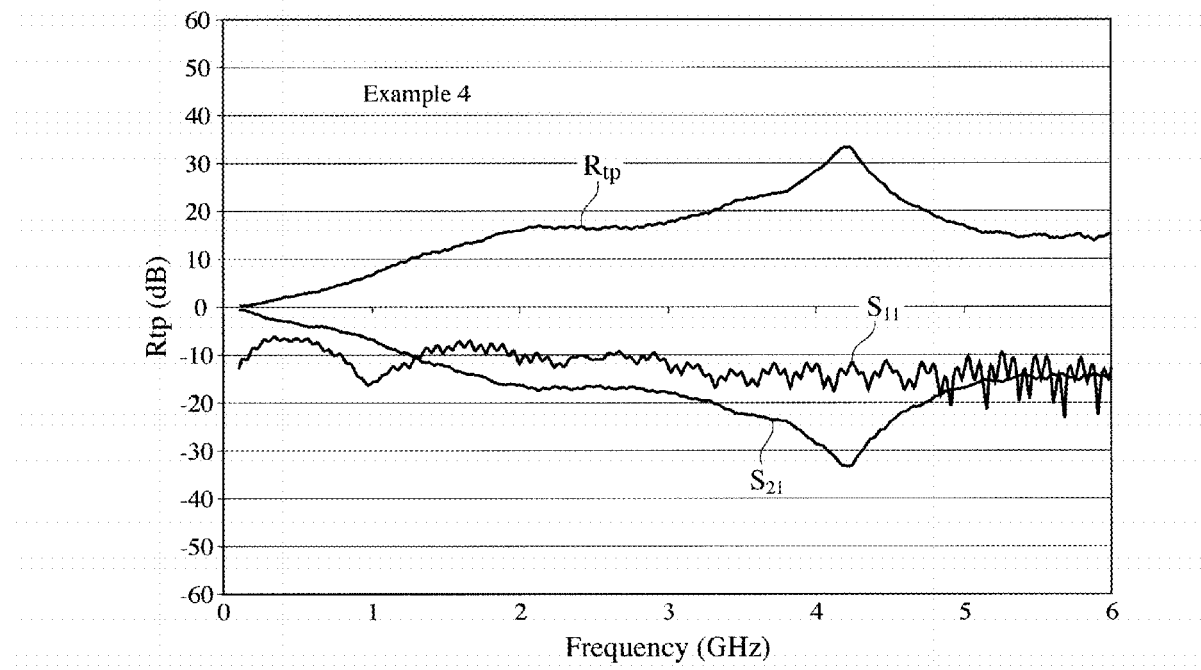
FIG. 26 is a graph showing the $S_{11}$, $S_{21}$ and Rtp of the near-field electromagnetic wave absorbing film of Example 4 at 0.1-6 GHz.
Figure 27:
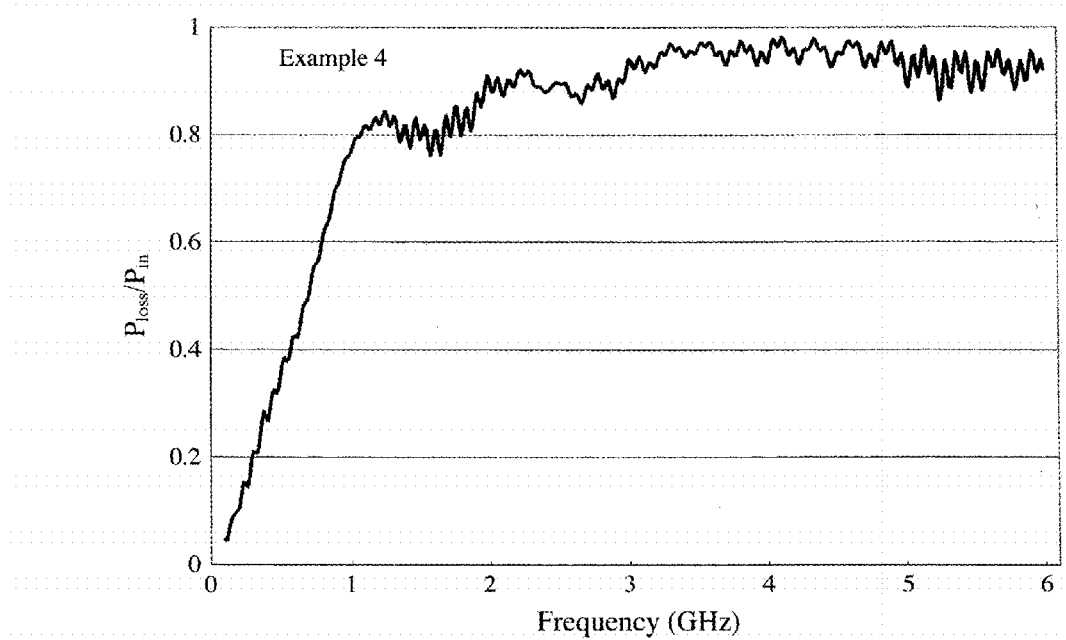
FIG. 27 is a graph showing the $P_{loss}/P_{in}$ of the near-field electromagnetic wave absorbing film of Example 4 at 0.1-6 GHz.
Figure 28:
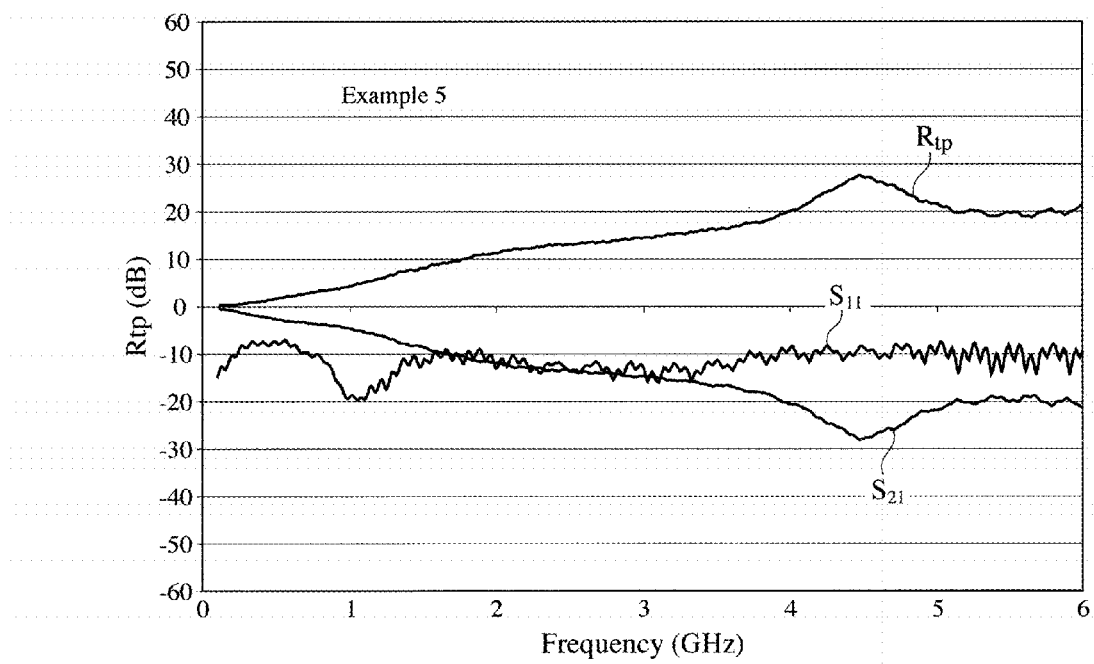
FIG. 28 is a graph showing the $S_{11}$, $S_{21}$ and Rtp of the near-field electromagnetic wave absorbing film of Example 5 at 0.1-6 GHz.
Figure 29:
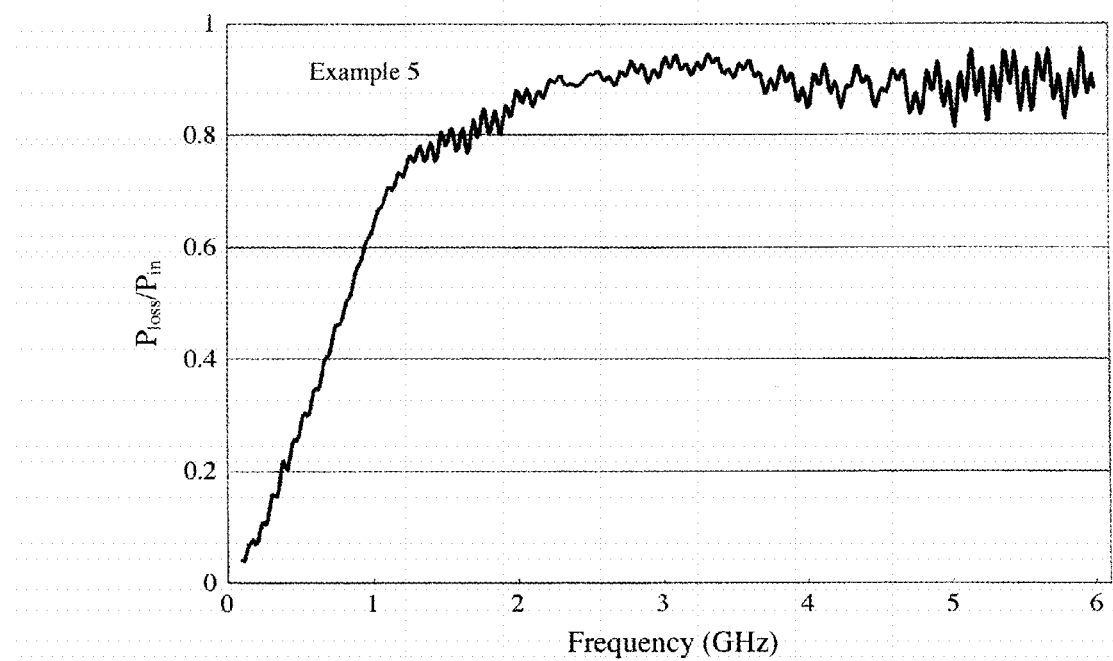
FIG. 29 is a graph showing the $P_{loss}/P_{in}$ of the near-field electromagnetic wave absorbing film of Example 5 at 0.1-6 GHz.

The reflected wave power $S_{11}$ and transmitted wave power $S_{21}$ of the composite film in a frequency range of 0.1-6 GHz were measured in the same manner as in Reference Example 1, to determine the noise absorption ratio $P_{loss}/P_{in}$. The noise absorption ratio $P_{loss}/P_{in}$ in a frequency range of 0.1-6 GHz is shown in FIG. 19. As is clear from FIG. 19, the composite film of Reference Example 2, whose laser-beam-bored holes 12 and electric resistance met the requirements of the present invention, had a high noise absorption ratio $P_{loss}/P_{in}$.

Examples 1-5

As shown in Table 2 below, openings 21 shown in any one of FIGS. 3-6 and 9 were formed in each composite film of Reference Examples 1 and 2, to produce a near-field electromagnetic wave absorbing film. The reflected wave power $S_{11}$ and transmitted wave power $S_{21}$ of a test piece TP2 of each near-field electromagnetic wave absorbing film to input power $P_{in}$ in a frequency range of 0.1-6 GHz were measured in the same manner as in Reference Example 1, to determine a transmission attenuation power ratio Rtp and a noise absorption ratio $P_{loss}/P_{in}$ in a frequency range of 0.1-6 GHz. With respect to Examples 1-5, FIGS. 20, 22, 24, 26 and 28 show $S_{11}$, $S_{21}$ and Rtp in a frequency range of 0.1-6 GHz, and FIGS. 21, 23, 25, 27 and 29 show $P_{loss}/P_{in}$ in a frequency range of 0.1-6 GHz.

TABLE 2

|  | No. | | | | |
| --- | --- | --- | --- | --- | --- |
|  | Example 1 | Example 2 | Example 3 | Example 4 | Example 5 |
| Thin Metal Film Metal (Thickness: nm) | Ref. Ex. 1 Ni (50) | Ref. Ex. 2 Al (80) | Ref. Ex. 2 Al (80) | Ref. Ex. 2 Al (80) | Ref. Ex. 2 Al (80) |
| Bored Thin Metal Film | FIG. 12 | FIG. 18 | FIG. 18 | FIG. 18 | FIG. 18 |
| Openings | FIG. 3 | FIG. 4 | FIG. 5 | FIG. 6 | FIG. 9 |
| Area Ratio of Openings (%) | 33 | 24 | 36 | 40 | 44 |

As is clear from FIGS. 20-29, any near-field electromagnetic wave absorbing films of Examples 1-5 had small reflected wave power $S_{11}$, and high transmission attenuation power ratios Rtp and noise absorption ratios $P_{loss}/P_{in}$. Also, the near-field electromagnetic wave absorbing films of Examples 1-5 had opening area ratios of 15-60%, providing good transmission viewability.

EFFECTS OF THE INVENTION

Because the near-field electromagnetic wave absorbing film of the present invention has large numbers of fine laser-beam-bored holes formed on the entire surface, and pluralities of openings as large as giving transmission viewability, it has excellent electromagnetic wave absorbability as well as good transmission viewability. The near-field electromagnetic wave absorbing film of the present invention having such features is suitable for electronic appliances having so-called skeleton structures whose inside can be viewed, such as cell phones, smartphones, robots, game machines, etc.

DESCRIPTION OF REFERENCE NUMERALS

1: Bored thin metal film
10: Plastic film
11: Thin metal film
11a: Remaining thin metal film portion
12: Laser-beam-bored hole
12a, 12b: Line of laser-beam-bored holes
13: Main remaining portion
14: Bridge-like portion
20: Near-field electromagnetic wave absorbing film
21: Opening
22: Post-opening remaining portion
120: Electrode
121: Electrode body portion
122: Electrode extension
130: Transparent acrylic plate
140: Cylindrical weight
220: Insulating substrate
221: Grounded electrode 222: Conductive pin
223: Coaxial cable
D: Diameter of laser-beam-bored hole
W: Width of bridge-like portion
T: Centerline distance between adjacent laser-beam-bored holes lines
TP1, TP2: Test piece of near-field electromagnetic wave absorbing film
MSL: Microstripline
NA: Network analyzer

What is claimed is:

1. A near-field electromagnetic wave absorbing film comprising a plastic film, and a single- or multi-layer, thin metal film formed on one surface of said plastic film;
   said thin metal film having laser-beam-bored holes of 200 µm or less in diameter with intervals of 50 µm or less on the entire surface, and pluralities of openings as large as giving transmission viewability partially on the surface.

2. The near-field electromagnetic wave absorbing film according to claim 1, wherein said laser-beam-bored holes have diameters of 100 µm or less.

3. The near-field electromagnetic wave absorbing film according to claim 2, wherein said laser-beam-bored holes have diameters of 20-100 µm.

4. The near-field electromagnetic wave absorbing film according to claim 1, wherein said laser-beam-bored holes are arranged with intervals of 20 µm or less.

5. The near-field electromagnetic wave absorbing film according to claim 1, wherein said openings formed in said thin metal film are arranged in at least two directions.

6. The near-field electromagnetic wave absorbing film according to claim 1, wherein the area ratio of said openings is 15-60%.

7. The near-field electromagnetic wave absorbing film according to claim 1, wherein the thickness of said thin metal film is 10-300 nm.

8. The near-field electromagnetic wave absorbing film according to claim 1, wherein said thin metal film is made of at least one metal selected from the group consisting of aluminum, copper, silver, tin, nickel, cobalt, chromium and their alloys.

* * * * *